United States Patent [19]

Kirby et al.

[11] E Patent Number: Re. 32,888

[45] Reissued Date of Patent: Mar. 14, 1989

[54] APPARATUS AND METHOD FOR SELECTIVELY ACTIVATING PLURAL ELECTRICAL LOADS AT PREDETERMINED RELATIVE TIMES

[75] Inventors: Ian J. Kirby, Warrington; Michael I. Mitchell, Chester; Andrew Stratton, Farnborough, all of England

[73] Assignee: Imperial Chemical Industries PLC, London, England

[21] Appl. No.: 152,927

[22] Filed: Feb. 5, 1988

Related U.S. Patent Documents

Reissue of:

[64] Patent No.: 4,324,182
Issued: Apr. 13, 1982
Appl. No.: 5,551
Filed: Jan. 22, 1979

[30] Foreign Application Priority Data

Feb. 2, 1978 [GB] United Kingdom ..... 4057/78

[51] Int. Cl.[4] ..... F42C 11/00
[52] U.S. Cl. ..... 102/217; 102/215
[58] Field of Search ..... 102/206, 215, 217; 361/248, 249, 251

[56] References Cited

U.S. PATENT DOCUMENTS

| | | | |
|---|---|---|---|
| 2,546,686 | 3/1951 | Bickel et al. | 102/23 |
| 3,067,684 | 12/1962 | Euker et al. | 102/206 |
| 3,312,869 | 4/1967 | Werner | 102/217 |
| 3,424,924 | 1/1969 | Leisinger et al. | 102/217 |
| 3,500,746 | 3/1970 | Ambrosini | 102/215 |
| 3,571,605 | 3/1971 | Dobson | 102/215 |
| 3,603,844 | 9/1971 | Fritz | 102/217 |
| 3,646,371 | 2/1972 | Flad | 102/215 |
| 3,748,955 | 7/1973 | Gatermann et al. | 102/217 |
| 3,851,589 | 12/1974 | Meyer | 102/217 |
| 4,145,970 | 3/1979 | Hedberg et al. | 102/206 |

FOREIGN PATENT DOCUMENTS

| | | |
|---|---|---|
| 2022356 | 5/1970 | Fed. Rep. of Germany . |
| 849948 | 12/1984 | South Africa . |
| 858413 | 11/1985 | South Africa . |
| 1493104 | 11/1974 | United Kingdom . |

*Primary Examiner*—Charles T. Jordan
*Attorney, Agent, or Firm*—Cushman, Darby & Cushman

[57] ABSTRACT

Separate electrical timing and load activation devices are provided for each of plural electrical loads and each device is connected to receive reference timing signals from a central unit. Each of the separate timing and load activation devices measures a reference time interval accurately defined by the reference timing signals and subsequently activates its associated electrical load after a respectively corresponding predetermined time delay which is determined as a function of the locally measured reference time interval.

63 Claims, 12 Drawing Sheets

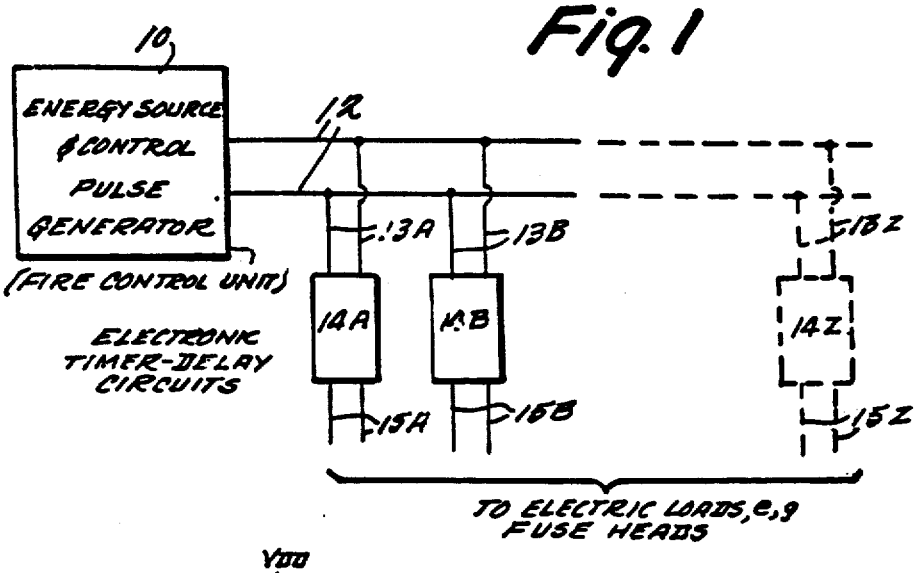
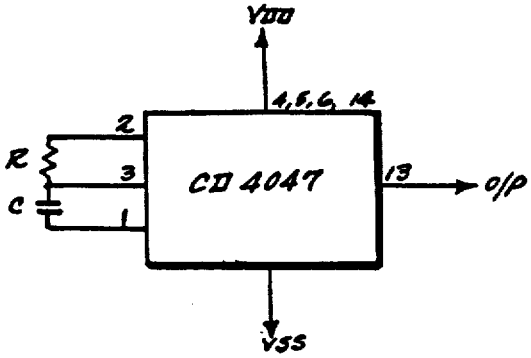
Fig. 14
Fig. 15
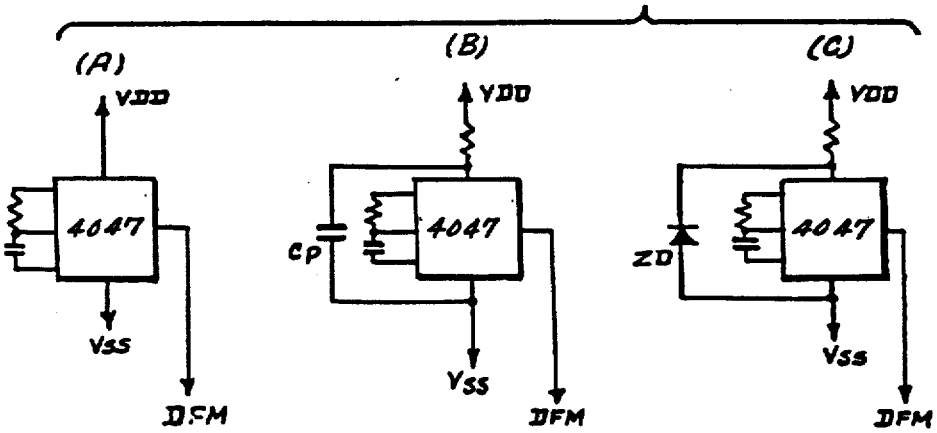
CIRCUITS UNDER TESTS
$f \approx 5KHz$ IC 12
RESET
IC 13
IC 14A
IC 14B
IC 9
IC 8
IC 7B
IC 7A
IC 2A
IC 6A
IC 6B
IC 5A
IC 5B
IC 3A
IC 3B
IC 4A
IC 4B
R8
C4
S1D
S1C
S1B
S1A
VDD
VSS
RESET
FROM Fig. 11A
ELECTRONIC TIME DELAY CIRCUIT-14-

PULSE LENGTH DISCRIMINATOR TIMING-DIAGRAMS

NOTES: (1) A "1" SIGNAL IS PRESUMED ON PIN 1 OF IC 2A.

(2) THE SPURIOUS OUTPUT AT "A" ABOVE DOES NOT PASS THROUGH SUCCEEDING CIRCUITS AS THE RESET IS STILL IN OPERATION AT THIS TIME.

(3) THE DURATION OF AN ACCEPTABLE PULSE LIES BETWEEN THE DURATIONS REPRESENTED BY THE TWO ARROWS AT "B" ABOVE.

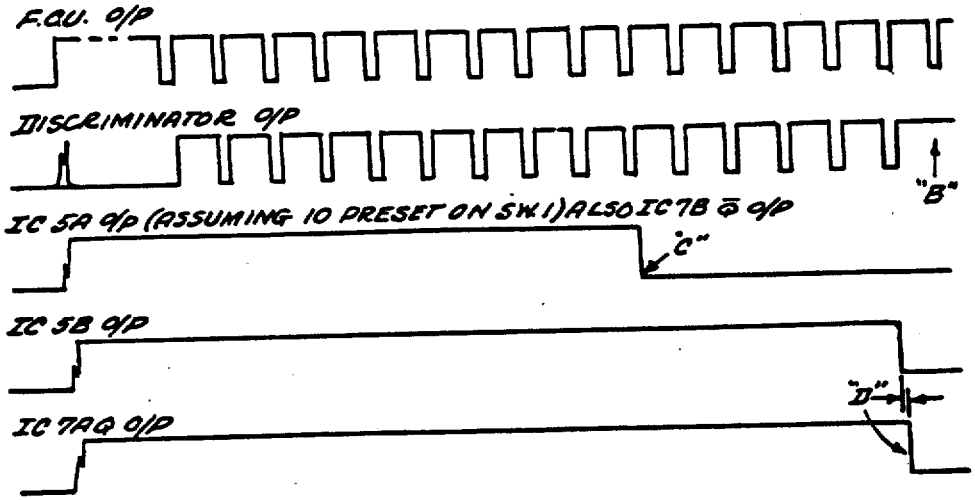

FUSE NUMBER COUNTER TIMING DIAGRAMS

NOTES: (1) IC 7B IS OPERATED IMMEDIATELY BY IC 5A OUTPUT ("C" ABOVE – IGNORING PROPAGATION DELAYS). IC 7A HOWEVER DOES NOT RESPOND IMMEDIATELY TO IC 5B CHANGE ("D" ABOVE). THE NEXT INTERNAL CLOCK PULSE IS AWAITED (IC 6B).

(2) THE IC 7AQ O/P INHIBITS THE DISCRIMINATOR OUTPUT SO THAT THE 16TH PULSE DOES NOT PASS ("E" ABOVE).

(3) THE TIME FROM "C" TO "D" ABOVE IS THE DELAY TIME TO BE STORED AND THIS IS THE INTERVAL DURING WHICH THE UP-DOWN COUNTER IS DRIVEN UPWARDS. AT "D" THE COUNTING IS REVERSED FEEDING OUT THE STORED DELAY.

Fig. 13

APPARATUS AND METHOD FOR SELECTIVELY ACTIVATING PLURAL ELECTRICAL LOADS AT PREDETERMINED RELATIVE TIMES

Matter enclosed in heavy brackets [ ] appears in the original patent but forms no part of this reissue specification; matter printed in italics indicates the additions made by reissue.

This invention is generally related to apparatus and method for selectively activating plural electrical loads at respectively corresponding predetermined relative times. More particularly, it is directed to electrically activated time delay fuseheads for explosive detonators and to a system comprising a plurality of such fuseheads, detonators and a central unit providing reference timing signals to the system. The invention also provides an improved method of blasting by sequentially initiating explosive charges in accordance with the invention.

It is often necessary to detonate explosive charges in a predetermined accurately timed sequence for many blasting and seismic prospecting and/or exploration operations. The accuracy of the relative time intervals between successive explosions is important, inter alia, to limit ground vibration, control fracturing and displacement of rock, and for producing significant seismic records. The accuracy of such relative timing affects both the efficiency and general economics of many blasting and seismic operations.

In the past, the time interval between initiation of consecutive explosive charges has usually been controlled by using pyrotechnic trains having a controlled burning rate (thus providing a propagation time delay) within the detonator casings between the fusehead and the explosive charges or in the pyrotechnic train linking two detonators. Such conventional time delay detonators may be either electrically or explosively initiated and are typically manufactured in one or more series with various lengths of pyrotechnic delay composition so as to give predetermined nominal delay intervals.

It is also known to generate a controlled time sequence of electrical signals for more or less initiating the fuseheads in a plurality of electrical detonators at accurately timed intervals. (See, for example, U.S. Pat. Nos. 2,546,686; 3,312,869; and 3,424,924.) However, to guard against the possibility of damage of interconnecting wiring by one of the earlier explosions, it is necessary to incorporate a pyrotechnic delay of sufficient time length in all detonators so as to ensure that all of the fuseheads have been electrically initiated before the first explosion occurs.

Accordingly, in many delay systems using electric fuseheads, the time interval between explosive charges actually depends on the difference in time delay between at least two pyrotechnic delay trains. The accuracy of such timing intervals is thus dependent on the statistical variance of the mean of each delay time from the design delay time as well as the variance of each delay time about such a mean. The achievable accuracy in actual production has become a limiting factor in many blasting and seismic operations. Furthermore, production quality of such time delay systems can only be monitored through destructive sample testing which is expensive and, in any event, the pyrotechnic delay incorporated in each of a series of delay detonators is usually physically different in one or more respects. To meet requirements for different timing intervals, it is also usually necessary to produce more than one series of delay detonators.

Several prior proposals have also been made for locating expendable electronic timing circuits at each blasting site. See, for example, U.S. Pat. Nos. 3,067,684; 3,571,605; 3,646,371; and 3,500,746. Various techniques are suggested in these patents to attempt compensation for frequency variations in the local timing oscillator and/or to make that oscillator crystal controlled. However, the actual relative time delays actually realized are determined by the degree to which a predetermined frequency standard is achieved by the local oscillator in most cases. However, U.S. Pat. Nos. 3,646,371 and 3,500,746 do show artillery shell electronic time delay fuses having relatively complex digital feedback circuits to a remote setting circuit which compensates detected local oscillator frequency variations by adjusting the number of oscillator pulses counted during a subsequent time delay period.

However, it has now been discovered that using this invention a system of plural electrically activated time delay fuseheads can be provided with a significantly improved relative timing accuracy and with greater flexibility in selecting desired relative time delays between the various time delay fuseheads in a system. The result is a more reliable, more accurate and more safe operation. Each fusehead in the system of this invention is activated or ignited at an accurately timed delay interval after a common starting signal transmitted to all fuseheads. After the start signal has been received, all further electronic time measurements are made locally at each fusehead site as a function of a previously measured accurately timed interval between reference signals earlier received from a central location. The result is the accurate time delayed firing of a series of fuseheads in a predetermined time sequence regardless of any damage which might occur to interconnecting wiring during the actual explosive operation.

In the presently preferred exemplary embodiment, an electronic "fire control unit" is remotely sited and connected to transmit coded signals to each of the plural electrically activated detonators in an explosive system. Such signals may be transmitted, for example, over a parallel fed two-wire signal transmission system. Each of the electrically activated detonators incorporates an electronic fuse unit together with a pyrotechnic initiating composition and/or base charges as appropriate for detonating a main explosive charge. Each of the electronic fuse units are preferably identical except for differing digitally coded electronic addresses or "fuse numbers" which are related to the relative times of fuse activation after receipt of a starting signal.

Unlike conventional electric time delay detonators, the time delay will not be primarily dependent upon the propagation time in a pyrotechnic train or the like. Rather, the time delay is generated in a precise electronic manner at each electronic fuse unit based on information previously received from the central fire control unit. Just prior to a blasting operation, each of the individual electronic fuse units are energized by the fire control unit which also transmits information signals regarding the respective predetermined time delays. This information is effectively stored by each of the respective electronic fuse units and then acted upon electronically on command from the fire control unit.

This invention presents less stringent fuse design requirements and affords much greater flexibility in achieving relative time delays from a single series of manufactured electronic detonators which are substantially identical electrically and mechanically. Accordingly, more simple manufacturing and stock control procedures may be used.

The electronic fuse units and/or detonators employing such units are simple to install and may integrally incorporate protection from spurious electrical and/or magnetic energy sources. Such fuses may also be connected in multiple parallel channels and controlled to fire consecutively or concurrently. In the presently preferred exemplary embodiment, time delays are achieved by counting clock pulses from a local clock pulse generator over an interval accurately defined by the central and nonexpendable fire control unit. An equal or proportionate time interval is later generated by counting an equal number of pulses from a pulse frequency derived from and proportionate to the frequency of the local clock pulse generator. Since each electronic time delay fuse is expendable (i.e., destroyed during the explosion), it is preferable to use a relatively cheap oscillator or clock pulse generator. This is quite feasible with this invention since the relative time delays obtained are a function of the stability of the clock pulse generator over a relatively short period of time rather than of the absolute frequency of oscillation. That is, even though the various local clock oscillators of a system may all be operating at substantially different frequencies, so long as each local oscillator is relatively stable over a relatively short time (of the same order of magnitude as the desired maximum time delay), then the overall accuracy and precision of the system timing will be very good.

There are various acceptable techniques for transmitting the required reference time information from the central fire control unit to the expendable time delay electronic fuses. For example, a series of accurately time spaced pulses may be transmitted simultaneously to all of the fuses with appropriate address counters in the fuses selecting time intervals between predetermined ones of the train of pulses as the reference time inverval for that particular fuse. A subsequent time delay period may then be measured by each fuse as a function of its own peculiar reference time inverval. Such time delay periods may be measured beginning at a common starting signal for all fuse units or, alternatively, the measurement of the time delay period may begin immediately upon conclusion of the reference time interval for one or all of the fuses in a system. Alternatively, a single reference time interval may be transmitted to and received by all of the electronic fuse units which thereafter measure their own respectively corresponding predetermined time delay periods based upon the measured reference time interval (e.g., one-half, one-third, one, one-and-one-half, etc. of the reference time interval). Of course, if desired, two or more of the fuse units may be caused to respond in the same way to the same control signals so that energy will be fed simultaneously to plural electrical loads such as electrical fuseheads. These techniques as well as variations and modifications of such techniques will be more completely understood from the following detailed description of an exemplary embodiment.

In the case where characteristic control signals for any given electronic fuse are selected by counting control pulses, a first predetermined count can be used to identify the beginning of a reference time interval. Similarly, a second predetermined count can be used to identify the end of a reference time interval. Of course, for a plurality of loads, the second predetermined count may either be the same for all loads or greater than the first predetermined count by a specified number. For example, the first predetermined counts allocated to a series of electronic fuseheads may be consecutive numbers and the fuseheads will then be energized either in numerical order of the complement of the first predetermined counts relative to the common second predetermined count plus unity or, alternatively, simply in the numerical order of the first predetermined counts. Again, these and other possibilities will be better appreciated after the detailed exemplary embodiment is better understood.

Where control signals are counted to identify the proper reference timing interval for a given fusehead, a preset (i.e., pre-decoded) electronic counter may be used to determine when the count reaches the first and second predetermined counts mentioned above. Alternatively, appropriate logic may be attached to the interstage outputs of a conventional electronic counter for comparing its contents with one or more predetermined numbers stored in a register or other data storage means.

In the exemplary embodiment to be described below, the actual time delay measurement is made utilizing a local clock pulse generator and a reversible counter for counting such clock pulses at the site of each electronic fusehead. The actual delay period between the start signal transmitted from the fire control unit and the activation of the connected electrical load is determined by counting from a predetermined initial contents (which may be zero) in one direction at the beginning of the reference time interval, stopping the count at the end of the reference time interval and subsequently reversing the direction of the counter and activating the connected electrical load whenever the counter contents again reaches the initial starting value (which may be zero). The reverse counting operation may be started immediately at the conclusion of the reference time interval or, alternatively, may be started at some subsequent time from a separate "start" signal transmitted from the first control unit.

The energy required for activating the connected electrical load (e.g., an electric fusehead) together with all additional energy required for operating the electronics signal selecting, processing and timing system at the site of each load is preferably supplied from the central fire control unit by either alternating or direct current. When an AC source of energy is utilized, both the energy for activating the load as well as the control signals are conveniently (but not necessarily) fed through a transformer arrangement. The control or informational signals may be realized as interruptions of and/or modifications to such AC or DC electrical currents from the fire control unit.

For example, when the load is an electrical fusehead, the energy storage unit may be realized by a capacitor which is charged by electrical energy coming from the fire control unit. This capacitor then stores sufficient energy to maintain operation of the electronics for the required time delay periods and, in addition, to activate the connected electrical fusehead so that the system will continue to operate as desired even if interconnecting wires with the fire control unit are damaged during earlier explosions.

Each electronic time delay circuit preferably also includes means for identifying predetermined characteristics of the legitimate control signals (e.g., signal pulse duration of frequency) so that only energizing signals having selected predetermined characteristics will even by passed to the time delay circuitry. See, for example, the commonly assigned, copending applications Ser. No. 109,109, filed Jan. 2, 1980, and Ser. No. 4265 filed Jan. 17, 1979. Suitable means are also included for separating and/or deriving control signals from the electrical energy supplied by the fire control unit. Other means are provided to reset or preset correct circuit starting conditions upon initial energization of the circuit by the fire control unit and prior to the storage of sufficient energy for load activation. Means are also provided for protecting the electronics from damage by excess input voltages.

These and other objects and advantages of this invention will be better and more completely understood by reading the following detailed description of an exemplary embodiment in conjunction with the accompanying drawings, of which:

FIG. 1 is a schematic block diagram of a system according to this invention embodying a centralized fire control unit for supplying both firing energy and time control pulses to a series of electrically activated fuseheads;

FIGS. 12 and 13 are signal timing diagrams useful in explaining the operation of the circuits shown in FIGS. 2, 10 and 11;

FIGS. 14 and 15 are schematic diagrams of exemplary local clock pulse generators which may be used with this invention.

Referring to FIG. 1, an energy source 10 supplies firing energy and a sequence of timing control pulses through wires 12 and 13A to electronic time delay circuit 14A which, in turn, is connected to an electrically activated load (e.g., the fusehead of an electric detonator) by wires 15A. Other electronic time delay circuits 14B–14Z (as many as desired within system limitations) are connected in parallel or series (not shown) to the centralized control unit 10 via wires 12 and to the electrically activated loads (e.g., fuseheads) by wires 15B–15Z.

Figure 2:
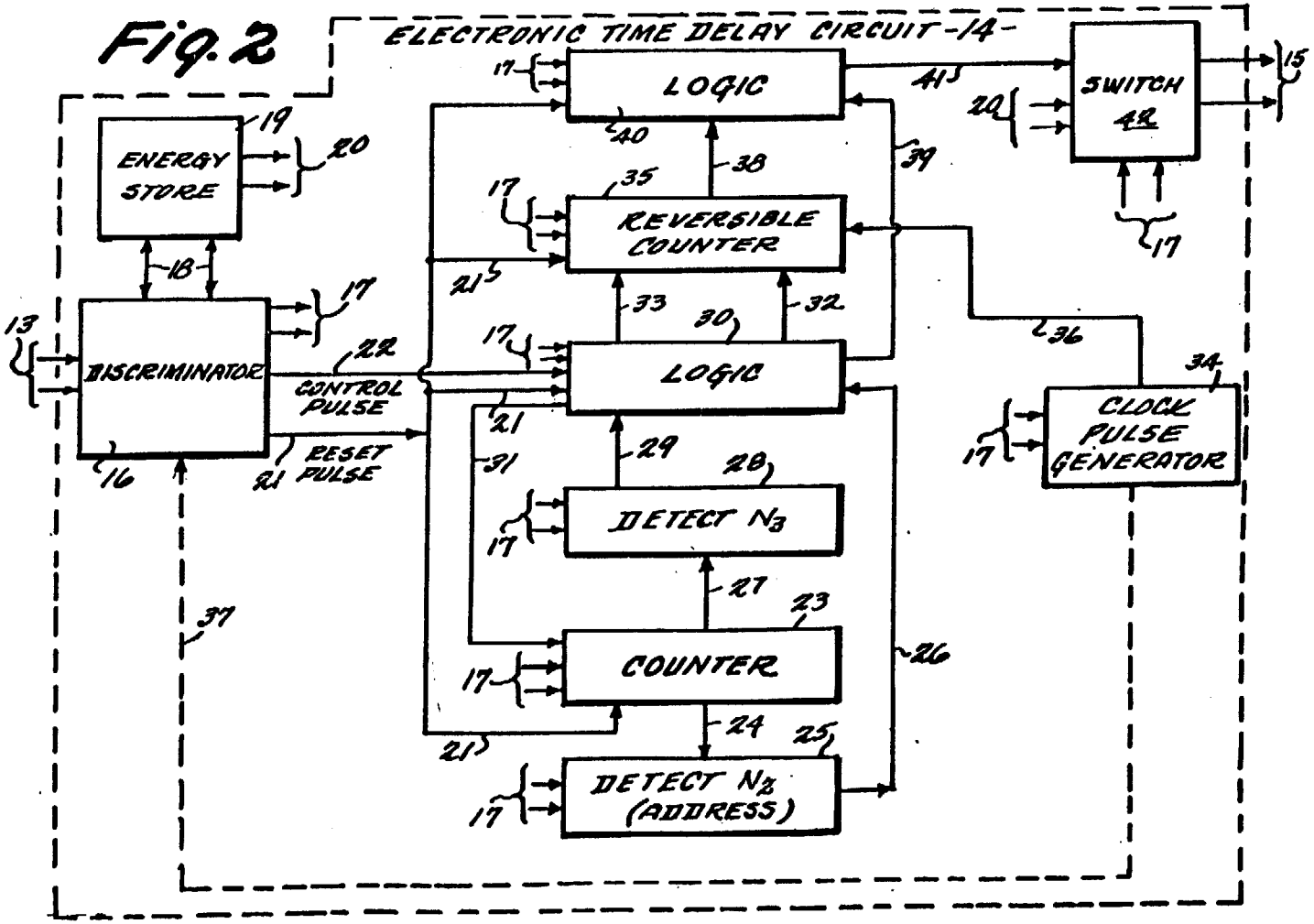
FIG. 2 is a more detailed schematic block diagram of the electronic time delay circuits associated with each of the fuseheads in FIG. 1.

Each time delay circuit 14A–14Z of FIG. 1 is shown in more detail at FIG. 2. Here input electrical energy and control pulses are fed to a discriminator unit 16 through wires 13. Unit 16, through wires 17, supplies appropriate operating voltages for the electronic timing circuits and, through wires 18, supplies energy to an energy store 19. The energy store 19 is usually a capacitor having sufficient capacity to ensure that, even if the wires 13 are broken after system operation is initiated, energy will flow from the store 19 through wires 18 to provide the required operating voltages on the lines 17.

The initial receipt of energy by unit 16 generates a reset pulse on line 21 which positively sets (directly or indirectly) pulse counters 23 and 35 and logic units 30 and 40 to an appropriate starting state. Discriminator 16 also preferably contains means for identifying the informational time control pulses received via wires 13 and feeding them via line 22 to logic unit 30. The contents of counter 23 are set by the reset pulse on line 21 to equal a predetermined number $N_1$ (zero in this exemplary embodiment). The control pulses are fed to counter 23 via line 31 under the control of logic unit 30. An address unit 25 receives the state of counter 23 via lines 24 and determines when the contents of counter 23 equals a second predetermined number $N_2$ that is greater than $N_1$ and, at the time of such equality, generates a first control signal via line 26. $N_2$ is the address number which identifies an individual time delay circuit 14 and is defined by the equation.

$$N_2 = M + m - 1$$

wherein M is a number greater than $N_1$, and is the same for all time delay circuits 14, m is an integer greater than or equal to unity and less than or equal to a chosen number $m_0$ that determines the maximum length of the sequence of loads (e.g., fuseheads) that can be fired from a single input on wires 13. A series of time delay circuits 14 to fire fuseheads in time sequence is selected from time delay circuits with address number M, M+1, M+2, . . . (M+m−1) . . . (M+$m_0$−1). In any series of fuseheads, the fuseheads in this particular exemplary embodiment will then be individually exploded either in ascending or descending numerical order of the address number.

A further address unit 28 receives the state of the counter 23 via lines 27 and determines when the contents of counter 23 equals a third predetermined number $N_3$ which is greater than $N_2$. At the time of such equality, a second control signal is generated via line 29. In any series of fuseheads, $N_3$ may be the same for all time delay circuits or ($N_3$–$N_2$) may be the same for all time delay circuits in the exemplary embodiment.

A clock pulse generator 34 produces clock pulses which may be fed, if desired, via line 37 to the discriminator unit 16 and used as a timing means against which the durations of the control pulses are identified. However, in the exemplary embodiment other means are used for discriminating against control signals having improper pulse durations. The clock pulses are fed via line 36 to a reversible digital counter 35 that can count in either a forward or reverse direction in response to a third control signal from logic unit 30 on line 32. The count in counter 35 is started and stopped by a fourth control signal from logic unit 30 on line 33. The reset pulse on line 21 initially sets counter 35 to zero and sets logic unit 30 to a starting state such that the control pulses when received on line 22, are transmitted via line 31, a forward count control signal is produced on line 32 and a control signal inhibiting the counting of clock pulses by counter 35 is produced on line 33.

On receipt of the first control signal via line 26, logic unit 30 changes the state of the fourth control signal on line 33 to start counter 35 counting forward. On receipt of the second control signal via line 29, logic unit 30 changes the third control signal no line 32 and the direction of counting by counter 35 is reversed.

In this embodiment the second control signal is also the starting signal for timing the delay interval before the fusehead fires. However, in an alternative embodiment, the starting signal is arranged to occur at a predetermined number of control pulses after the receipt of the second control signal. In this alternate embodiment logic unit 30, on receipt of the second control signal, is arranged to alter the fourth control signal again and thereby halt counting by counter 35. Then, or receipt (via line 22) of a further number of control pulses (that may be unity), logic unit 30 reverses the direction of counting by counter 35 by alternating the third control signal on line 32 (the delay starting signal) and also starts the reverse count by altering the fourth control signal on line 33. In both these embodiments, either (a) receipt of the second control signal by logic unit 30 inhibits further control pulses being passed via line 31 to counter 23, or (b) the design of counter 23 is such that counter state $N_3$ is transmitted via lines 27 when the number of control pulses received by the counter 23 is equal to or greater than $N_3$. Counter 23 may also be made incapable of overflowing or exceeding $N_3$ to insure accurate detection of this condition. (See British Pat. No. 1,258,892.

Resuming with explanation of the illustrated exemplary embodiment, when the direction of counting by counter 35 has been reversed, the logic unit 30 feeds an indicator signal on line 39 to a logic unit 40. When the contents of counter 35 have returned to zero, a further indicator signal is produced on lines 38 and fed to logic unit 40, whereupon logic unit 40 produces a fifth control signal on line 41 that causes a switch 42 to connect the energy store 19 through lines 20 and lines 15 to the fusehead (not shown in FIG. 2).

In the examples of timing sequences shown in FIGS. 3, 4, 5 and 6 the selected values $N_1=0$, $M=1$ and $m_0=6$ are merely illustrative. Furthermore, the intervals between control pulses have, purely for illustration, been selected as equal. Time is shown on the horizontal axes together with control pulses, $P_1$, $P_2$, $R_3$—and the contents of counter 23. The vertical axes show the contents of reversible counter 35 as time advances, the individual steps being, for clarity, approximated by a straight line.

Figure 3:
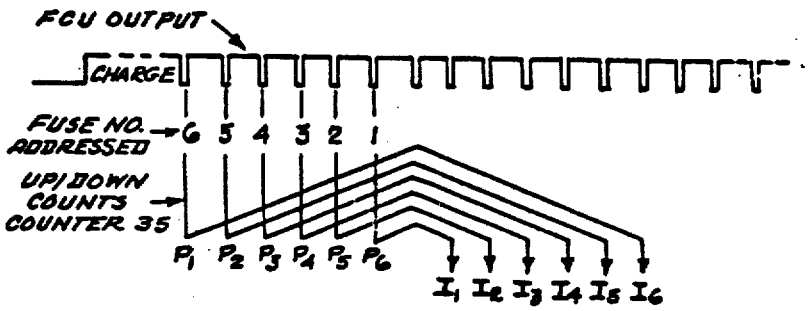
FIG. 3 shows a timing sequence similar to that of the exemplary embodiment of FIG. 1.

In the embodiment of FIG. 3 counting by counter 35 starts when the count in counter 23 reaches the address number $N_2$. When the count in counter 23 reaches $N_3=7$ all time delay circuits commence a reverse count by counter 35 and ignition of the detonators takes place at $I_1$, $I_2$, $I_3$ . . . $I_6$ in reverse numerical sequence of the address number $N_2$.

Figure 4:
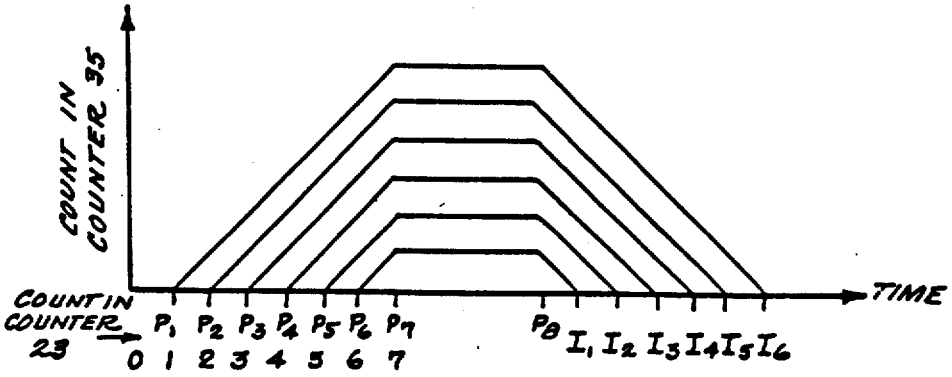
FIGS. 4–6 show exemplary alternative timing sequences for a series of electric fuseheads fired in accordance with this invention.

In the embodiment of FIG. 4, when the contents of counter 23 reaches $N_3=7$, the counting by counter 35 stops. The next control pulse $P_8$ is transmitted after a predetermined delay, whereupon all ignition circuits commence a reverse count by counter 35 giving ignition at $I_1$, $I_2$, $I_3$ . . . $I_6$ in reverse sequence of the address numbers $N_2$.

Figure 5:
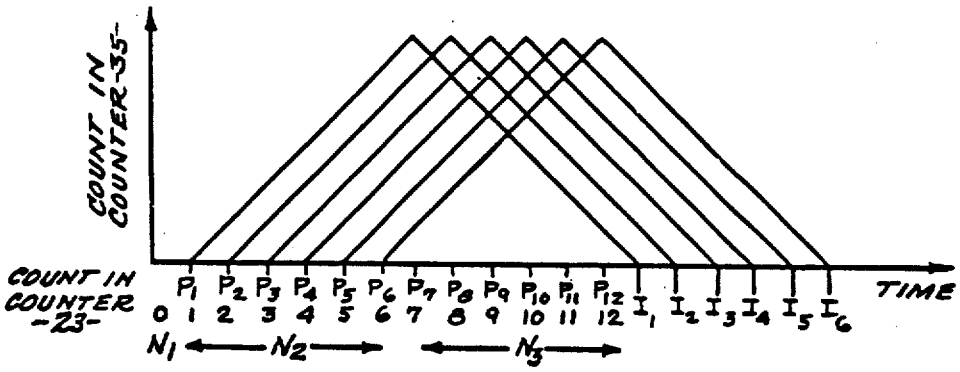

In the embodiment of FIG. 5, forward counting starts when the address number $N_2$ is reached and, when $N_3-N_2=6$, the count by counter 35 is reversed and ignition takes place at $I_1$, $I_2$, $I_3$ . . . $I_6$ in numerical sequence of the address numbers $N_2$.

Figure 6:
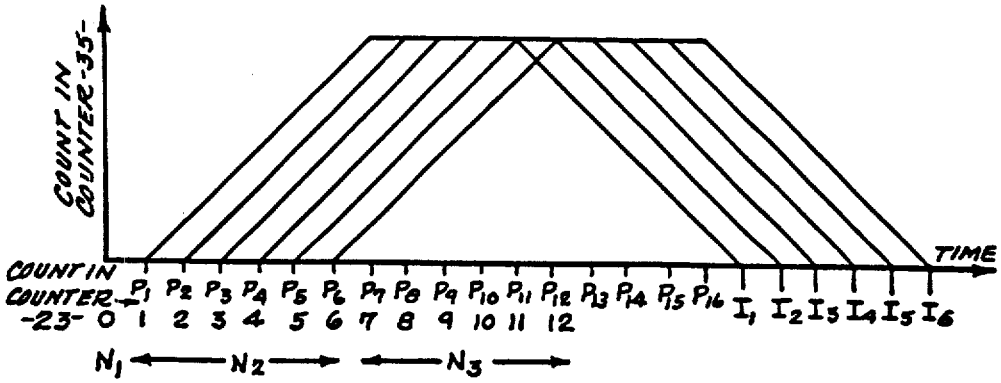

In the embodiment of FIG. 6 the counting by counter 35 stops when $N_3-N_2=6$ and is reversed after a count of 4 control pulses.

It will be evident that, provided the frequency of the clock pulse generator is stable between forward and reverse counts, the contents of the counter at reversal and hence the precise clock frequency is not significant and all timing intervals are (subject to circuit design limitations) effectively determined by the accurately controlled intervals of the control pulses through conductor wires 12 and 13.

All or part of the components of each time delay circuit 14, except the energy store 19, may be assembled as an integrated circuit on a semiconductor chip and assembled with the energy store and the fusehead in a detonator casing.

Before describing specific exemplary circuits in greater detail, the overall operation of the system will again be reviewed. With the system connected as shown in FIG. 1, the fire control unit (FCU) is activated. It provides a DC current for an initial charging period (see the top portion of FIG. 3) for charging up the energy storage device (e.g., a capacitor) 19 at each remote fuse site. After this initial charging period (e.g., of the order of 30 seconds), the output of the FCU is interrupted briefly at precisely timed intervals (see FIG. 3). These negatively going pulses (in the exemplary embodiment) function as timing reference or control signals and are simply transmitted in a continuous series until the blasting operation is completed. As will be appreciated, a more complex form of timing reference signals could also be employed.

Each individual electronic fuse 14 incorporates a "preset" counter 23 which responds to these control pulses by generating two internal control signals. The first internal signal occurs at a preset count of counter 23 which is related to the particular delay time period desired for that particular fuse. The second internal signal from counter 23 corresponds to its maximum count and is the same in this simple exemplary embodiment for all fuses 14.

Additionally, each fuse 14 incorporates an "up/-down" counter 35 driven by an internal local clock pulse generator 34. Counter 34 is driven upwardly by the internal clock upon receipt of the first internal control signal from counter 23 and is reversed upon the occurrence of the second internal control signal from counter 23 for this simple exemplary embodiment wherein the starting signal is coincident with the end of the accurately timed reference interval defined by the central fire control unit. When the up/down counter 35 reaches its original starting count (in this simple exemplary embodiment) and the preset counter 23 has previously generated the second internal control signal (i.e., reached its maximum count in the exemplary embodiment), the storage capacitor 19 is then discharged through its respectively associated electrically activated fusehead which then ignites its explosive detonator without further substantial delay. Accordingly, in this simple exemplary embodiment, the actual time delay period set into a given time delay circuit 14 is determined immediately prior to system operation by the FCU as the time interval during which the up/down counter 35 is permitted to count upwardly. The time delay actually achieved by a given circuit during the subsequent down count of counter 35 is primarily dependent for its precision on the frequency stability of the internal oscillator 34 over the duration of the "up" and "down" counting operations. However, such precison is not dependent upon the absolute frequency of the oscillator which may vary, within limits, from one time delay circuit 14 to another.

In the simple exemplary embodiment depicted by FIG. 3, the fuses are numbered according to their firing order which, in turn, depends upon the preset count associated with counter 23 (e.g., $N_2$). In this instance, a fuse will always fire first in sequence if it has the highest preset count $N_2$.

For example, sustained and intermittent AC signals (for charging and control purposes, respectively) may also be used. A controllable time interval between "setting" and "effecting" a given time delay and the inclusion of a number of initial "passive" counts by counter 23 (to permit an additional degree of protection against breakthrough of spurious control signals) are variations of the general type depicted in FIGS. 4–6.

In the exemplary embodiment, the time delay circuitry is composed of commercially available CMOS integrated circuits and number of discrete components. However, for mass production, the entire circuit (with the probable exception of the energy storage capacitor) is preferably formed as a "single chip" integrated circuit using standard integrated circuit manufacturing techniques. It is even possible that an electrically activated fusehead itself may be physically attached to or otherwise associated with the integrated circuit substrate. This present exemplary embodiment also features a non-polarized input, protection against static and electromagnetic interference, automatic reset of the various electronic circuits before the energy storage capacitor is capable of firing a fusehead, pulse duration discrimination circuits for filtering spurious signals, and an integrated circuit power switch which is capable of igniting the electrically activated fusehead.

As earlier mentioned, in a blasting environment, the lead wires to any given fuse may be disrupted by earlier explosions and it is essential that the fuse continue to operate independently of such lead wire disruption. This means that the electronic time delay circuit must have sufficient internally stored electrical energy to drive the electronics efficiently and to ignite the fusehead at the end of some maximum desired delay period (e.g., several seconds). In the exemplary embodiment a capacitor has been chosen as the energy storage element. The energy requirements for operating the electronic circuits are minimized by using low power semiconductor technology such as the well known CMOS integrated circuits which require very little energy in the non-switching state.

However, in the present embodiment, appreciable energy consumption is required by the internal clock generator and subsequent driven circuits which are continuously being switched unless they are operated at very low voltages (e.g., less than 3 volts). At the same time, when lower operating voltages are used, the frequency stability versus supply voltage characteristics of available oscillator circuits may be poor enough to adversely affect the time delay precision that is obtainable with these circuits. While a crystal controlled oscillator could be employed, this would necessarily increase the cost of each expendable time delay circuit. At higher operating voltages, the current drain caused by an oscillator may cause considerable decay of the voltage across the storage capacitor even for large values of capacitance (e.g., 1000 microfarads). Accordingly, it is preferred to use techniques for limiting such current drain and/or to shield the clock from the supply voltage decay so as to prevent adverse loss of precision in the time delay measurements.

As described in more detail below, experiments have been carried out with a CMOS integrated circuit oscillator (CD4047) used in several different types of circuits. The CD4047 circuit has a very low power requirements and a good frequency stability versus supply voltage characteristics. Nevertheless, the precision achievable by a given system is, from a practical standpoint, limited by the size and quality of storage capacitor which is employed. The range of capacitance which may be considered has a lower limit determined by fusehead ignition requirements (approximately 1–10 millijoules at approximately 1.0 ampere current level) and electronic switch resistance and to a lesser extent the interval resistance of the capacitor. This lower limit is approximately 250 microfarads using the present four ohm switch and one ohm fusehead resistance. This limit may be further lowered by using a higher fusehead resistance and/or lower switch resistance (e.g., by using discrete switch contacts). An upper limit on capacitance is determined by considerations such as size and cost and may well be in the region of 1,000 microfarads at 15 volts.

Other factors influencing the choice of storage capacitance and operating voltage relate to safety and device security. The charging time required for the storage capacitor is preferably a relatively long period so as to provide a safety factor in terms of accidental activation and to improve capacitor performance after long shelf storage periods. On the other hand, too long a wait at this time would often be disadvantageous in practice. Furthermore, a high opening voltage makes it less likely that interference signals will successfully penetrate the logic circuits. Many of the above design factors will be modified in the case of the design of a special integrated circuit unit.

The simple exemplary embodiment which has been operated and which is now being described employs only simple internal oscillator and voltage stabilizing circuits which have limited performances. Similarly, the up/down counter 35 employed in this simple embodiment has only eight stages so that the oscillator is necessarily run at a very low frequency and available precision is limited by the relatively long clock period. Nevertheless, as described in more detail below, the successful operation to date of this exemplary embodiment has proven that this invention provides time delay precision much better than that obtainable from conventional pyrotechnic delays. For examples, the precision that can be obtained using this invention is in excess of existing requirements of less than 0.1% over a four-second delay. For shorter delay periods, the magnitude of error would be further reduced. Furthermore, since there is at least some small unavoidable delay after power is applied to an electrical fusehead before the main explosive is detonated, and since these relatively smaller delays are also subject to variation, there is probably an upper limit to the precision required from the electronic timing circuits. Of course, this latter contribution to variation in detonation of the explosive after power is applied to the electric fusehead also depends to some degree on the value of storage capacitance employed as should be appreciated.

When AC power is utilized for energizing the electronic time delay circuits, protection against accidental or unauthorized activation of the circuits may be enhanced by utilizing the invention described in the copending, commonly assigned application Ser. No. 4265 filed Jan. 17, 1979, by Dr. Andrew Stratton.

Figure 7:
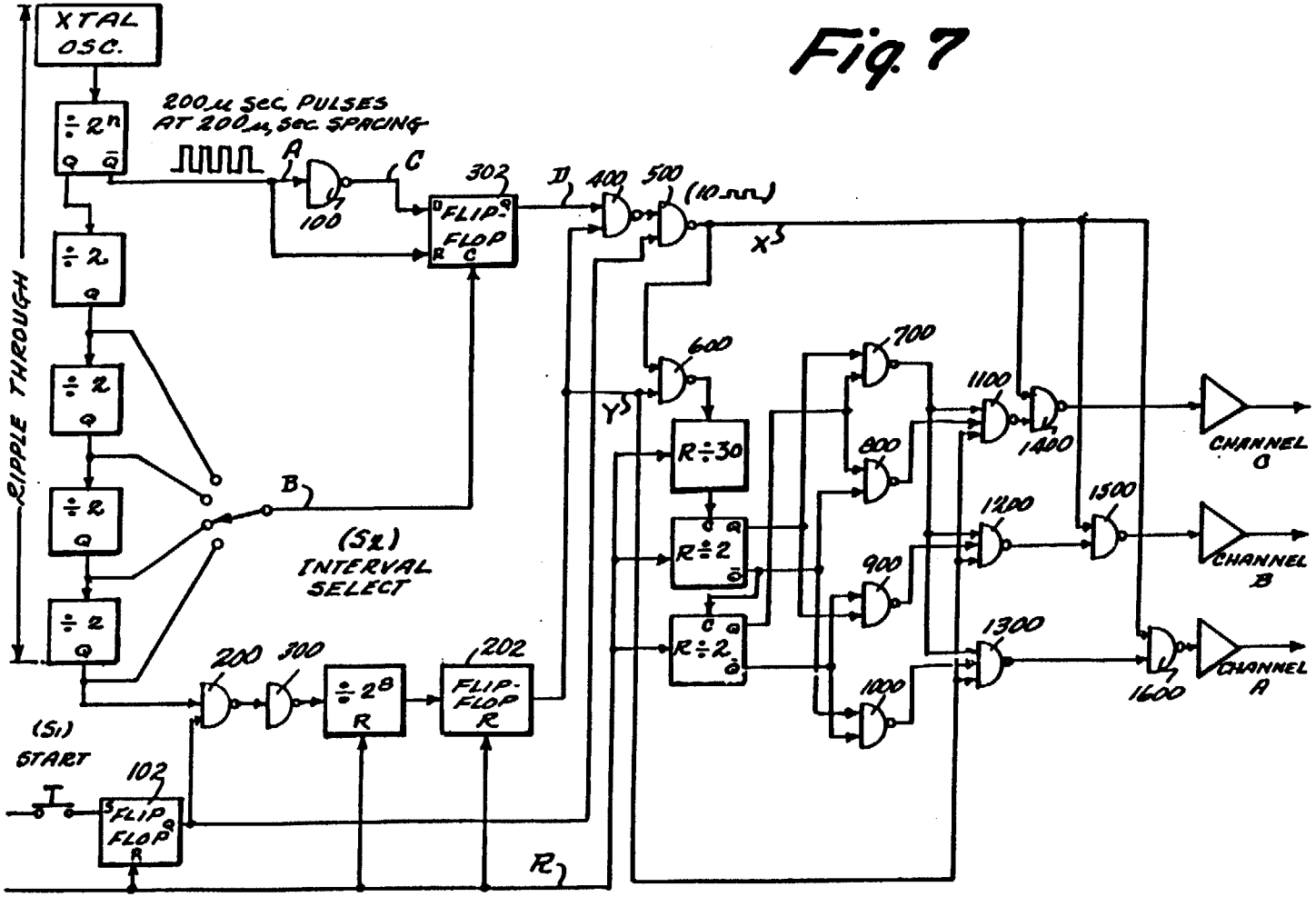
FIG. 7 is a schematic diagram of a simple form of fire control unit that can be used with this invention.

The function of the FCU 10 is to charge, address, program and initiate the electronic time delay fuses. It will usually to portable, robust (insensitive to knocks and vibrations) and capable of operation from either utility power sources or battery supplies. A relatively simple FCU 10 is depicted in FIG. 7. More sophisticated FCU's can be designed for specific applications.

The output (or outputs, if more than one channel is used) of the FCU 10 in FIG. 7 comprise an initial uninterrupted charging signal (DC in the exemplary embodiment) which may last for 25 seconds or longer. Thereafter this supply is interrupted at intervals for short durations. Such interruptions form the control pulses by which the individual fuses (or groups of fuses sharing the same fuse numbers) are addressed, have delays stored and are initiated. The exemplary fuse design here described requires an initial charging current of about 5 ma reducing to around 1 ma when adequate charging has occurred. Thus, to control 100 such devices, the FCU 10 supplies maximum currents of about 0.5 amps. This fuse also requires charging to about 15 volts and accepts control pulses (when the DC supply is interrupted) having a duration of about 200 microseconds.

Figure 8:
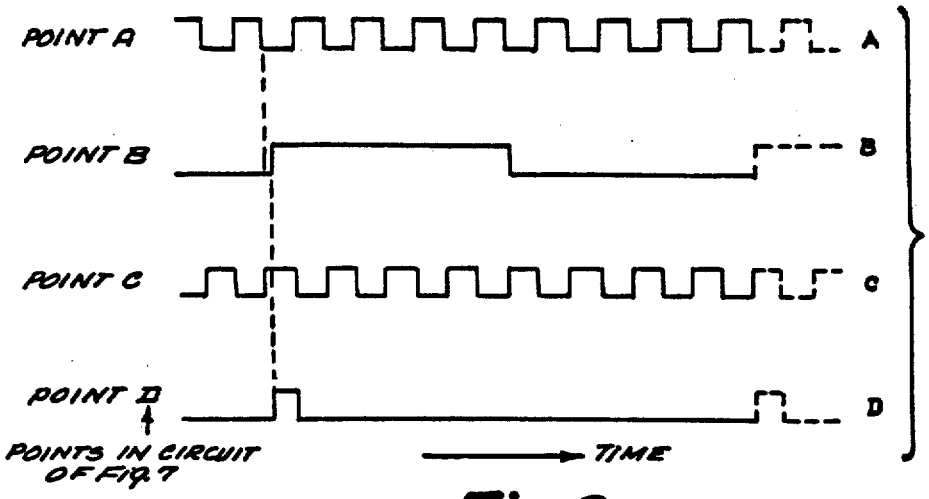
FIGS. 8 and 9 are signal timing diagrams useful in explaining the operation of the circuit shown in FIG. 7.

Referring to FIG. 7, when power is applied the "reset" system (line R) is activated. The crystal oscillator and the associated divider chain function but, due to the reset states of flip-flops 102 and 202, no changing signals pass NAND gates 200, 400 and 500. The system incorporating NAND gate 100 and flip-flop 302 is, however, completely functional as long as power is supplied. The operation of this system is as follows—(see timing diagram of FIG. 8)

Each positive pulse at A applies a reset to flip-flop 302 and, in the absence of any positive-going signals at B, flip-flop 302 remains in the reset state with its Q output at "0" (point D). Because of the propagation delay as signals "ripple through" the divider chain, any positive-going signal at B will be preceded by a negative-going signal at A. Thus, when a positive-going signal arrives at B it "clocks" the "1" signal at C (the inversion of A) into the Q output of flip-flop 302. The next positive pulse at A resets the flip-flop 302 returning this Q ouptut to "0". The subsequent negative-going signal at B produces no effect on flip-flop 302. Thus, from the time power is applied, pulses of approximately 200 microseconds duration are produced at D at the intervals selected by switch 52.

Figure 9:
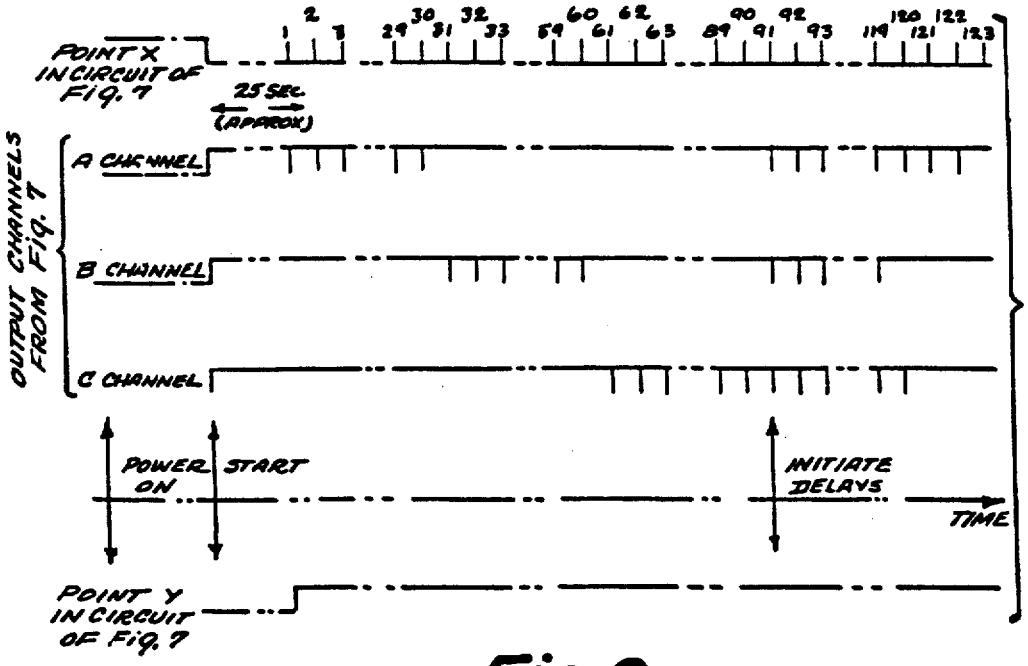

When the start switch S1 is operated, flip-flop 102 is set and its Q output goes to "1". The output of NAND gate 500 goes to "0" and the 10 c/sec pulses pass through NAND gate 200 and NAND gate 300 to the $2^8$ unit, the positive-going edges triggering it. When $2^8$ pulses have passed (i.e., after approximately 25 secs.), an output pulse sets flip-flop 202 and its Q output goes to "1", opens the NAND gate 400 just before one of the short positive-going pulses at D. Thereafter the pulses from D are superimposed on the output of NAND gate 500 (point X). The general form of this output is shown in FIG. 9.

The effects of this output on subsequent stages may now be considered:

(1) When power is switched on, the 3 remaining dividers are reset to zero. The input at X is "1" and Y, "0" so that the output of NAND gate 600 is held at "1", NAND gates 1100, 1200 and 1300 each have a "0" input from Y and therefore give "1" outputs. With X at "1" at this time, the outputs of NAND gates 1400, 1500 and 1600 are low, i.e., at "0".

(2) When the start switch is operated, X goes to "0" and the outputs of NAND gates 1400, 1500 and 1600 go high, i.e., to "1", Y is still at "0" so no other changes occur.

(3) After approximately 25 secs and just before the first pulse appears at X, Y goes to "1", opening NAND gate 600 and releasing NAND gates 1100, 1200 and 1300 to the control of NAND gates 700, 800, 900 and 1000. Only NAND gate 1000 has a "0" output so only NAND gate 1300 has a "1" output. NAND gates 1400 and 1500 are therefore closed and only NAND gate 1600 is open.

As the positive pulses arrive at X, they are gated through NAND gate 1600 to channel A. The tail end of the pulses operate the 30 unit which was previously reset. The tail end of the 30th pulse produces an output to the first 2 unit switching it. NAND gate 1600 is then closed and NAND gate 1500 opened, gating the next 30 pulses to channel B. At the end of this period both 2 units switch and NAND gate 1500 is closed and NAND gate 1400 opened, gating the next 30 pulses to channel C. At the end of this period the first 2 unit again switches and all three gates are opened for the next 30 pulses. Thereafter the pattern is repeated until the power is removed from the fire control unit. Driver amplifier units A, B and C provide the power outputs to the three channels. The output waveforms are also represented in FIG. 9.

Note: The FCU here described is intended for fuses incorporating a five stage (0–31) preset counter 23 with fuse numbers ranging from 1 to 30. Each channel receives its 31st pulse when all three channels are pulsed thus initiating all delays coincidently.

Figure 10:
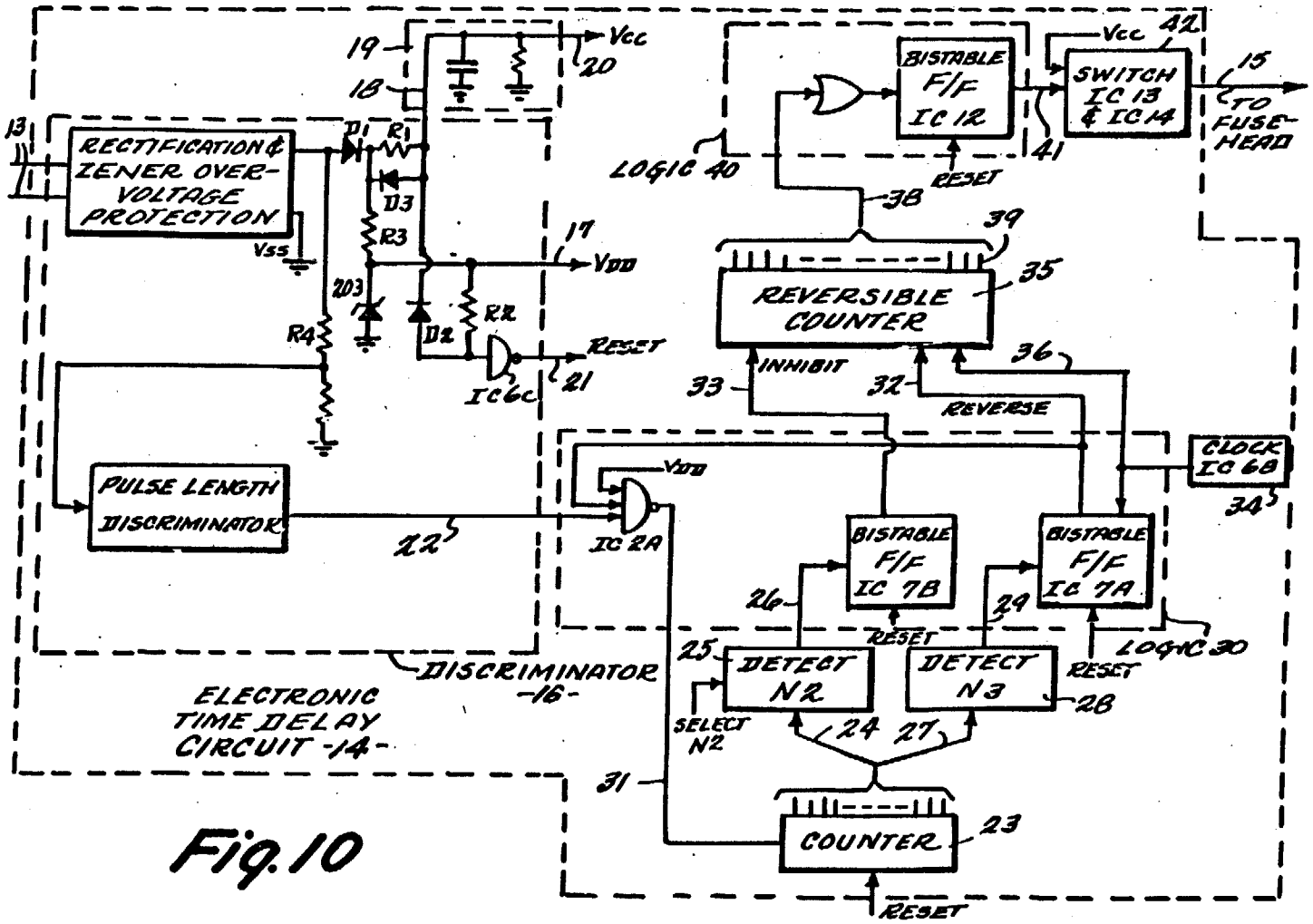
FIGS. 10, 11A and 11B are increasingly more detailed schematic diagrams of the electronic time delay circuitry shown in FIG. 2.
Figure 11A:
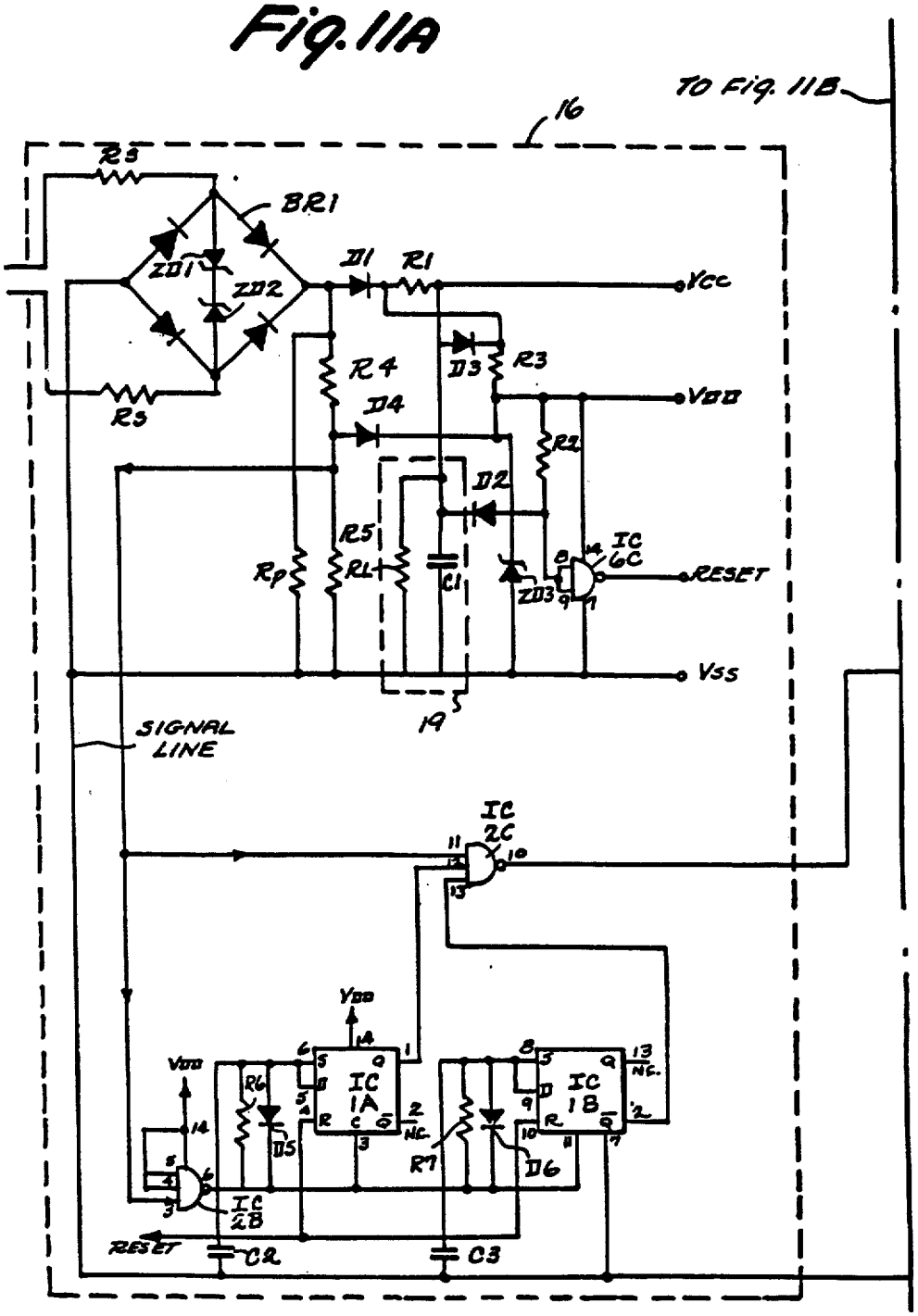
Figure 11B:
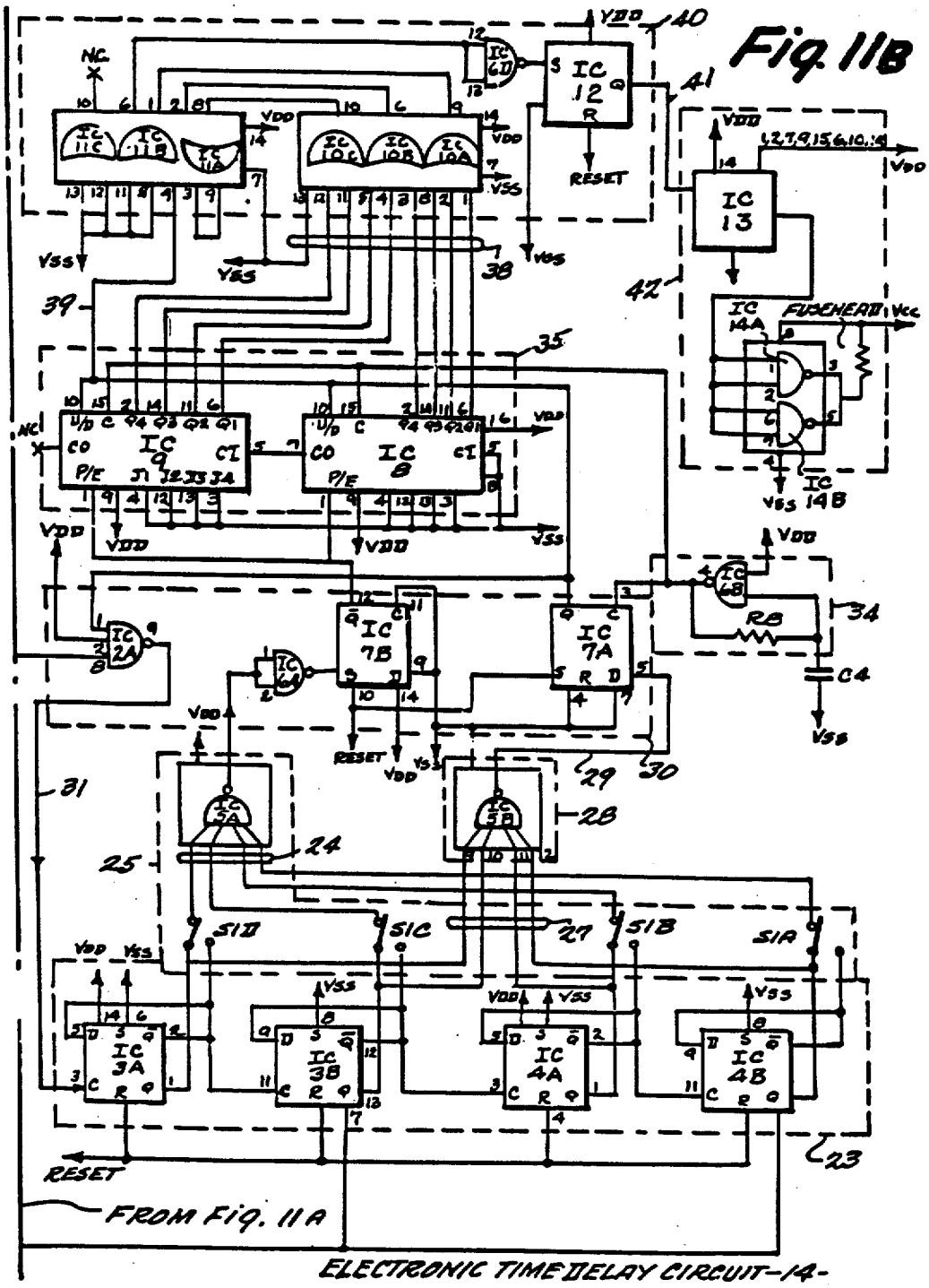

Exemplary electronic time delay fuse circuitry 14 is shown in increasing detail at FIGS. 2, 10 and 11. The specific circuitry shown in FIG. 11 has been used to demonstrate the feasibility of the system but has only limited performance characteristics, particularly in terms of delay precision. For example, the internal osillator and its supply circuits are simple designs and, since only a limited number of divider stages are included, the oscillator frequency is low providing low actual delay time resolution capabilities. However, an discussed in more detail below, much greater precision can be obtained by more sophisticated circuit designs based upon the same general principles of circuit operation as those included in the exemplary FIG. 11 circuit.

FIG. 10 is simply a less detailed depiction of FIG. 11 and is included to help the reader appreciate its functional relationship to FIG. 2. Since the same reference symbols are used for common elements in both FIGS. 10 and 11, the following detailed description of the circuit depicted in these FIGURES will be made only with specific reference to FIG. 11.

The CMOS integrated circuits depicted in FIG. 11 are identified by the letters "IC" followed by an assigned numeral for each separate chip and an alphabetic suffix where plural functional circuit blocks are actually included on a common IC chip. As previously indicated, all circuit elements or their equivalents (except possibly the energy storage capacitor) can be realized on a single special purpose CMOS IC chip, if desired, using conventional semiconductor technology. However, the identity of corresponding commercially available IC circuits for the present exemplary embodiment of FIG. 11 are given by the following table:

TABLE 1

| | |
|---|---|
| IC's 1,3,4,7 & 12: | CD 4013 (Dual "D"type flip-flop) |
| IC 2: | CD 4023 (Triple 3-Input NAND Gate) |
| IC 5: | CD 4012 (Dual 4-Input NAND Gate) |
| IC 6: | CD 4093 (Quad 2-Input NAND Schmitt Triggers) |
| IC's 8 & 9: | CD 4029 (Presettable Up/Down Counter) |
| IC's 10 & 11: | CD 4075 (Triple 3-Input OR Gate) |
| IC 13: | CD 40109 (Quad Low to High Voltage Level Shifter) CD 40107 (Dual 2-Inpact NAND Buffer/Driver) |

Dotted lines and reference numerals have also been included in FIG. 11 to show its relationship to FIG. 2. The exemplary circuits may be subdivided as follows:

1. Input circuits,
2. Signal discrimination,
3. Fuse address circuits,
4. Delay circuits,
5. Output switch.

Each of these functional subdivisions provides the following features and operating characteristics:

1. Input circuits (i) Protection from static and EMI

Two zener diodes (ZD1 and ZD2) are wired back to back across the series resistors at the terminations of the leading wires. If, due to static discharge, high currents flow from one leading wire to the other, the zener diodes carry virtually all of this current and also, with series resistors ($R_S$), clamp the voltage presented to succeeding circuits at an acceptable level. By this means the electronic circuits are protected from differential mode (i.e., from leading wire to leading wire) static discharge. By the same method EMI is limited to voltage levels which will not damage the electronic circuits. Protection from common mode static discharge (i.e., form either or both leading wires to case) may be provided by suitably located insulation which will ensure discharge by a path which precludes damage or spurious ignition and/or by an isolation transformer. Connection, directly or indirectly via suitable devices, may also be made from either or both leading wires to case so as to provide safe discharge paths.

(ii) Bridge rectification

The bridge rectifier (BR1) is included so that there is no need to observe polarities of leading wires when connecting fuses in circuit.

(iii) Signal/power storage routing circuits

Since only two leading wires are incorporated they have to carry charging current (to the electrolytic capacitor) and control signals (to the logic). Separation is achieved by means of a diode (D1) which is connected in series with the electrolytic storage capacitor (C1). When the initial long duration charging pulse is applied, current flows through D1 and through the series current limiting resistor (R1) charging C1 to 15 V. Thereafter the anode of D1 is free to follow the succeeding signal excursions, the diode being reverse biased when the signal line moves negatively. (Resistor $R_p$ serves to discharge the signal line which is subject to active pullup only.)

(iv) Reset signal

It is necessary to ensure that the various latches and counting circuits are in the proper state before significant charging of C1 occurs. To achieve this, a signal is derived from C1 which holds a low "0" signal for a significant period of time after the charging pulse is applied. This "0" signal is passed via diode (D2) to the input of IC6C and the inverted output is used as the "1" active "reset" signal. Since power ($V_{DD}$) to succeeding circuits is available through D1 from the onset of the charging pulse, the reset state is quickly achieved. On further charging D2 becomes reverse biased and C1 voltage no longer influences the reset circuit R2 feeding a high "1" signed into ICGC.

Thus a high "1" reset pulse is obtained initially but is removed well before controlo signals are received.

Note: Resistor RL discharges C1 over a larger time period (say 5 minutes). This ensures that C1 is not charged up over a long period by interference and does not hold appreciable residual charge (e.g., from testing). Otherwise the "reset" operation might be inhibited.

(v) Logic supply voltage stabilization

The logic supply voltage ($V_{DD}$) is stabilized by a zener diode (ZD3) to a nominal 5.6 volts. A resistor (R3) carries current to the system from the fire control unit via the charging diode (D1) or, when this source is not available (i.e., when the fire control unit is supplying low "0" signals or when the leading wires have been disrupted), from C1 via a further diode (D3). This stabilized voltage ($V_{DD}$), in addition to determining the "1" level of the reset line, also limits the "1" level of the control signals via the clamping diode (D4) and the series resistor (R4). The total voltage ($V_{CC}$) across the storage capacitor is made directly available to the output circuits. $V_{SS}$ is the common return line.

2. Signal discrimination

Figure 12:
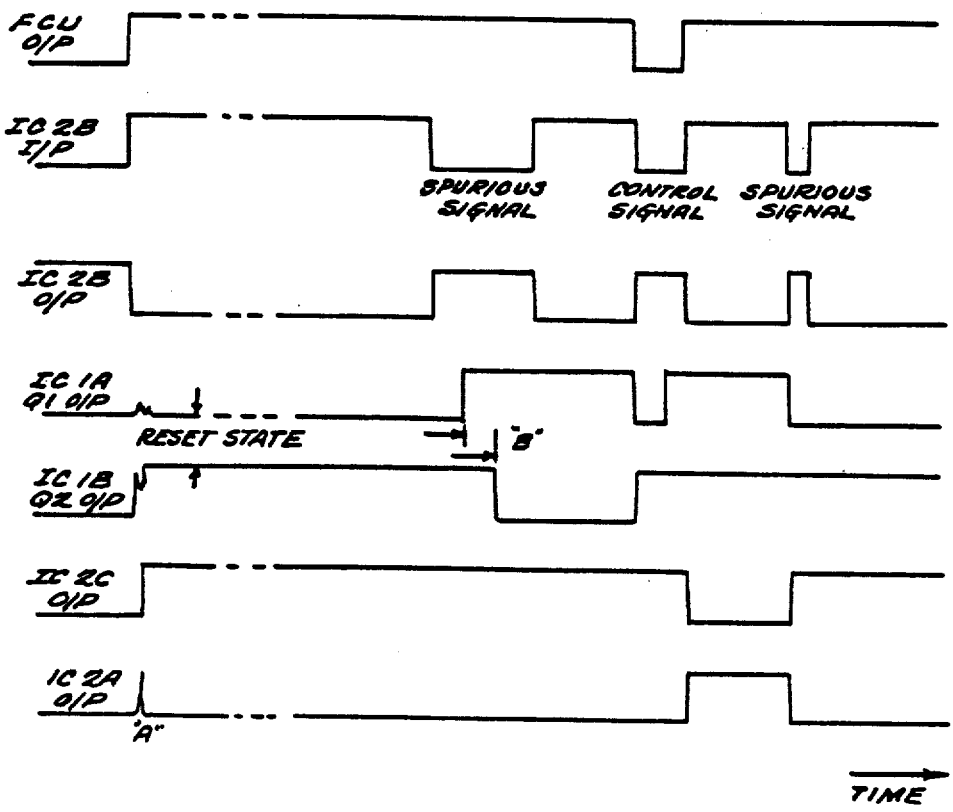

A pulse length discriminator is included for this purpose (see timing diagram in FIG. 12).

Initially flip-flop IC1A and IC1B are reset and the fire control unit feeds a "1" on the signal line. This signal, inverted by IC2B, gives a low "0" signal on the clock inputs of IC1A and IC1B. The "0" Q output of IC1A produces a "1" output from IC2C which means that all three inputs of IC2A are at "1" (IC7A flip-flop has also been set) and the output of IC2A is 0. When an input pulse is received the signal line goes to "0" output from IC2A. At the same time the output of IC2B goes to "1". Since both D inputs are at "0" no change is produced by the clocking action of IC1A and IC1B. For the duration of the input pulse the capacitors C2 and C3 charge up positively via associated series resistors R6 and R7. When the input pulse is terminated (going to "1") it gates the outputs of the two flip-flops (via IC2C). The outputs (Q of IC1A and $\overline{Q}$ of IC1B) will both be ("1") if and only if the input pulse has lasted long enough to permit C2 to charge to the setting voltage of IC1A but not long enough to permit C3 to charge up to the setting voltage of IC1B. Therefore, a "0" output will be obtained from IC2C if and only if the positive duration of the input pulse lay between the two prescribed limits. Provided pin 1 of IC2A remains in the "1" state an inverted "1" output will then be obtained from IC2A and will last until the next pulse arrives at the input, closing the gate (IC2C) and clocking both flip-flops to the reset state. (C2 and C3 will have discharged via diodes D5 and D6 respectively at the end of the input pulse giving a "0" on the D inputs to be transferred to the Q outputs by the positive-going signal on the C inputs.)

Thus, in summary, if a negative-going pulse of acceptable duration is applied to the discriminator input (and if pin 1 of IC2A is high—see below), a positive output pulse will be produced which will last from the termination of the input pulse until the arrival of the next input pulse.

3. Fuse address circuits (See timing diagram in FIG. 13.)

IC3 and IC4 form a 16-state (0–15 BCD) counter which is driven by the positive-going edges of the discriminator output pulses. Initially, the counter is "reset" to zero. The first rising clock pulse from the discriminator transfers the "1" on the Q and D terminals of IC3A to its output. The Q output falls and produces no effect on succeeding stages. The second rising clock pulse transfers the "0" and the Q and D terminals of IC3A to the Q output. The Q output rises and transfers the "1" on the Q and D terminals of IC3B to its Q output. The IC3B Q output falls and produces no effect on succeeding stages, etc. Binary counting results in which IC3A provides the least significant digit and IC4B the most significant digit. The four single-pole changeover switches S1A, S1B, S1C, and S1D permit the connection of either output of each counter stage to the four inputs of IC5A. IC5A produces a "0" output when all four inputs are at "1" which can be arranged to correspond to any count (0 to 15) by suitable adjustment of the switches. This preset count is called the Fuse Number (actually restricted to 1 to 14).

Similarly IC5B produces a "0" output when all Q outputs of the counter stages are at "1" (i.e., at the maximum count of 15).

The "0" output obtained from IC5A at the perset count is inverted by IC6A and this change sets flip-flop IC7B which has been "reset" initially. When the present count is passed the flip-flop remains set.

The "0" output produced at the last count (15) from IC5B is passed directly to the D input of flip-flop IC7A which has been "set" initially by the "reset" signal. This D input ("0") is clocked into the flip-flop by the next positive-going signal from the internal oscillator IC6B. The flip-flop IC7A is thus "reset" giving a "0" Q output which is fed back to pin 1 of gate IC2A preventing the passage of any further input pulses through the discriminator to the fuse address circuits. The count rests at 15 and the flip-flop IC7A remains "reset".

Thus, in summary, initially the Q output of flip-flop IC7B is "reset" to "1" and the Q output of flip-flop IC7A is "set" to "1". As the control pulses arrive the counter indexes and when the preset count (corresponding to the fuse number) is reached flip-flop IC7B changes its Q output to "0". Similarly, when the maximum count of 0.15 is reached, flip-flop IC7B changes its Q output to "0". Both signals set into the flip-flops are retained until ignition.

Higher fuse numbers (more counting stages) may be incorporated, if desired, and a shift register system may be used rather than the counter as should now be appreciated.

4. Delay circuits

IC8 and IC9 contain an eight stage reversible counter (up/down counter) with a BCD capacity of 0 to 225. The output of the internal oscillator IC6B is connected to the clock (C) inputs of the counter to control the counting rate. Coupling between stages is internal except for the CO output of the fourth stage (the first four stages are in IC8) which is connected to the CI input of the fifth stage (in IC9). Initially counting is prohibited by the "1" P/E inputs from IC7B Q output but when this output is set to "0" (at the preset count of the fuse number counter) the internal oscillator IC6B clocks the counter upwards. When (at the maximum count of the fuse number counter), the Q output of IC7A is set to "0", the counting direction is reversed. The delay entered by the external control is the time for which the up/down counter is allowed to count upwards from 0 which is the same (within the limits of the circuit precision) as the time required by he clock to drive the counter back to 0. When the up/down counter returns to 0 (i.e., when all eight counter stages Q outputs are at "0"), the Q output of IC7A is also at "0". These nine "0" inputs to the "OR" gates of IC10 and IC11 produce for the first time since power was applied a "0" output on pin 6 of IC11. This output is inverted in IC6D and used to "set" flip-flop IC12 (previously "reset").

Thus, in summary, the input control signals determine the time from the preset count of the fuse number counter to its maximum count. At an equal interval of time after this maximum count the Q output of IC12 goes from "0" to "1".

5. Output siwtch

Since the output switch IC14 is supplied from the storage capacitor (C1) logic signals must have a "1" value of $V_{CC}$ and not $V_{DD}$ as previously. IC13 is therefore included to convert the amplitude of the high output of IC12 from $V_{DD}$ to $V_{CC}$. This "1" output, occurring at the end of the delay period, switches on the output switch IC14 and discharges C1 through the fusehead. The fusehead thereafter ignites.

As mentioned above, the precision achievable with the circuit of FIG. 11 can be enhanced by increasing the clock frequency and the number of counter stages. As also discussed, there are limits on achievable precision due to the size storage capacitor employed and the power consumption by the oscillator circuits. The performance of various CMOS oscillator circuits has been compared in terms of frequency stability and power consumption. In general, it has been found that the CD4047 based oscillator is preferred over other presently commercially available possibilities. A basic CD4047 oscillator circuit is shown in FIG. 14.

FIGS. 15A–15C show three different circuit arrangements. In FIG. 15A, the oscillator is connected directly across the supply. In FIG. 15B, a series resistance Rs is included to limit the supply current and capacitor Cp to meet demands for surge currents during switching. The final circuit in FIG. 15C again includes Rs but seeks to maintain a constant voltage across the oscillator by means of a zener diode.

Figure 16:
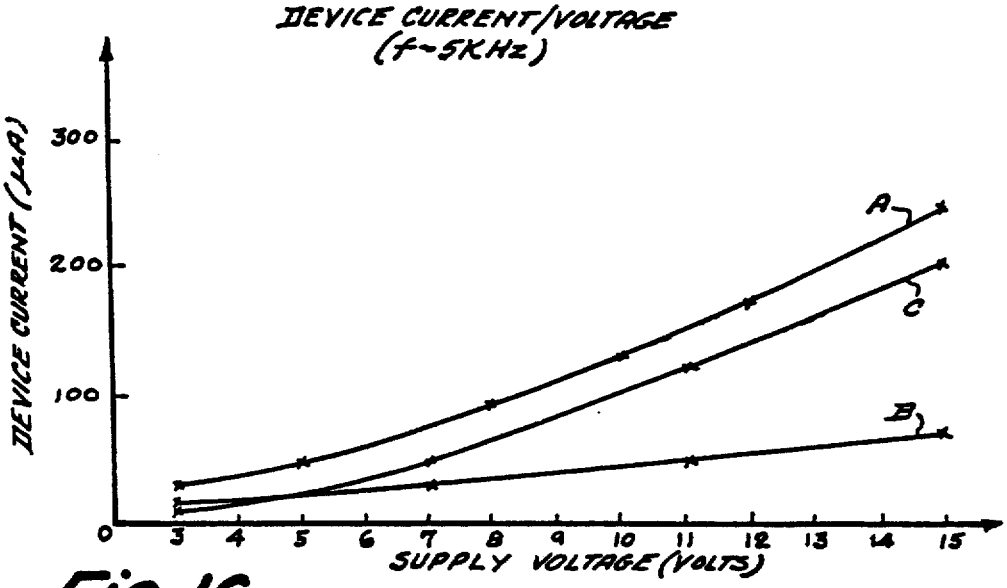
FIGS. 16 and 17 are comparative graphs showing different aspects of system performance when using the different types of local clock pulse generators shown in FIG. 15.
Figure 17:
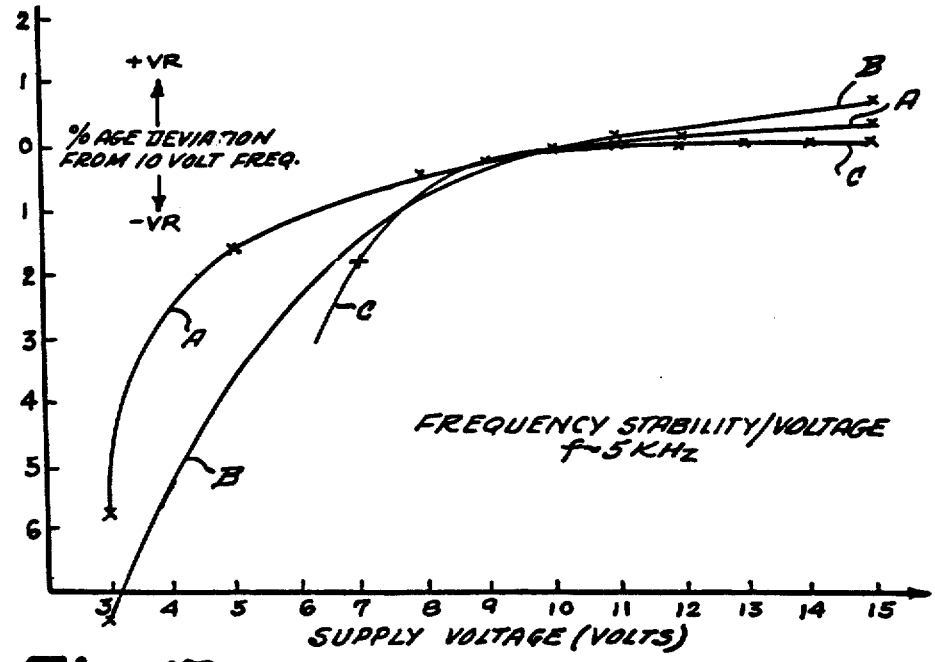

For these three arrangements the current consumption and frequency of the multivibrator (oscillator) where measured over a range of supply voltages, using various values of associated components as appropriate. Selected graphs for the three systems are shown in FIGS. 16 and 17.

If the multivibrator is powered from a storage capacitor of a given capacitance (C) which is precharged to a known voltage ($V_O$), then by reference to the current/supply voltage graphs it is possible to assess (by successive approximations) the residual voltage ($V_R$) across the capacitor after a given time (t)

$$V_t = CV_0 - i_{AV}t$$

where $i_{AV}$ is the average current during the discharge. (It is not possible to the precise in the exercise as the power dissipation of the CD4047 varies with respect to supply voltage in a manner far removed from the theoretical $P_{diss}=2CV^2f$, particularly at lower frequencies.)

Having assessed the voltage drop, the average deviation from the intitial frequency over the period (t sec) can be assessed from the corresponding frequency stability/voltage curves. It is then possible to calculate the corresponding error in delay which would result if the multivibrator were used as the internal oscillator of the electronic fuse. If power cut-off from the FCU occurred immediately when countdown started, the error would have a maximum value as the oscillator's frequency would be drifting over the whole delay period.

TABLE 2

| Parameters | Storage Capacitance C μF) | | | | | |
|---|---|---|---|---|---|---|
| Circuit A | 1000 | 500 | 100 | 1000 | 500 | 100 |
| Vo (volts) | 15.0 | 15.0 | 15.0 | 12.0 | 12.0 | 12.0 |
| Vt (volts) | 14.0 | 13.2 | 8.2 | 11.3 | 10.8 | 7.2 |
| $i_{Av}$ (μA) | 240 | 230 | 170 | 165 | 155 | 120 |
| f drift (%) | 0.06 | 0.13 | 0.8 | 0.04 | 0.12 | 1.0 |
| Error (%) | 0.03 | 0.07 | 0.4 | 0.02 | 0.06 | 0.5 |
| Circuit B | 1000 | 500 | 100 | 1000 | 500 | 100 |
| Vo (volts) | 15.0 | 15.0 | 15.0 | 12.0 | 12.0 | 12.0 |
| vt (volts) | 14.7 | 14.4 | 12.4 | 11.8 | 11.5 | 10.0 |
| $i_{Av}$ (μA) | 70 | 70 | 65 | 55 | 55 | 50 |
| f drift (%) | 0.04 | 0.08 | 0.4 | .03 | .07 | 0.3 |
| Error (%) | 0.02 | 0.04 | 0.2 | .02 | .04 | 0.15 |
| Circuit C | 500 | 200 | 100 | 1000 | 500 | 100 |
| Vo (volts) | 15.0 | 15.0 | 15.0 | 12.0 | 12.0 | 12.0 |
| Vt (volts) | 13.5 | 11.6 | 9.2 | 11.4 | 11.0 | 8.0 |
| $i_{Av}$ (μA) | 180 | 170 | 145 | 140 | 130 | 100 |
| f drift (%) | 0.00 | 0.01 | 0.32 | 0.02 | 0.03 | 0.85 |
| Error (%) | — | 0.01 | 0.16 | 0.01 | 0.02 | 0.43 |

Note:
The average device currents ($1_{Av}$) include an allowance for the requirements of circuits driven by the oscillator.

(A maximum delay of 4 seconds is presumed in the following exercise.)

Table 2 gives assessments of the size of this maximum error for various capacitor values and for selected components and initial conditions of the three supply systems considered. The components and conditions have been selected with a view to minimizing frequency drift—and corresponding delay error—but they are not necessarily optimum conditions. The actual values of components used were as follows:

TABLE 3

| | Rs | Cp | ZD (zener diode) |
|---|---|---|---|
| Circuit A | — | — | — |
| Circuit B | 100K | 0.1F | — |
| Circuit C | 47K | — | 5.2 volt nom. |

Experimental results on selected circuits have cemonstrated that achievable precision is in fair agreement with the appropriate estimate shown above.

Although only one exemplary embodiment has been described in detail above, those skilled in the art will appreciate that many variations and modifications may be made in this exemplary embodiment without departing from the novel and advantageous features of this invention. Accordingly, all such variations and modifications are intended to be included within the scope of the following claims.

What is claimed is:

1. Apparatus for selectively activating a plurality of electrical loads at respectively corresponding prdetermined relative times, said apparatus comprising:

a central unit for providing reference timing signals, and a separate electrical timing and load activation device electrically connected with each electrical load and also connected to receive said reference timing signals, each of said devices including timing means, means for providing first and second signals from the reference timing signals, a source of locally generated clock pulses, a timing counter means for counting the number of said clock pulses occurring between said first and second signals, and activation means for activating the connected electrical load after a subsequent time delay measured by counting a number of said clock pulses, the number of clock pulses counted bearing a predetermined relationship to the number counted between said first and second signal.

2. Apparatus as in claim 1 wherein:

said central unit also provides electical energy for use in activating said loads, and each of said devices includes an energy storage means connected to receive and store said electrical energy and to supply at least a portion of such stored energy to its associated electrical load when connected therewith after said respectively corresponding predetermined time delay.

3. Apparatus as in claim 1 or 2 wherein each of said devices is disposed at the site of its associated electrical load and continues to operate after receipt of said reference timing signals even if thereafter isolated from said central unit.

4. Apparatus as in claim 1 or 2 wherein the respectively corresponding predetermined time delays for all of said devices are measured from a common reference time also defined by said reference timing signals.

5. Apparatus for selectively activating a plurality of electrical loads at respectively corresponding predetermined relative times, said apparatus comprising:

a central unit for providing reference timing signals, and a separate electrical timing and load activation device electrically connected with each electrical load and also connected to receive said reference timing signals, each of said devices including timing means for measuring a reference time interval defined by said reference timing signals and for subsequently activating its associated electrical load after a respectively corresponding predetermined time delay which delay is determined as a function of said measured reference time interval and wherein said reference timing signals comprise a sequence of accurately timed events and wherein each of the timing means in said devices comprises a source of locally generated clock pulses, a preset counter means for counting said timed events and for providing first and second signals respectively corresponding to first and second predetermined counter contents, timing counter means for counting the number of said clock pulses occurring between said first and second signals, and activation means for activating the connected electrical load after a subsequent time delay measured by counting a number of said clock pulses, the number of clock pulses counted bearing a predetermined relationship to the number counted between said first and second signals.

6. Apparatus as in claim 5 wherein said second predetermined counter contents is identical for all of said devices.

7. Apparatus as in claim 5 wherein each device includes means for initially resetting said perset counter means and said timing counter means to predetermined initial contents.

8. Apparatus as in claim 5 wherein said central unit includes means for forming said sequence of accurately timed events as superimposed variations in the flow of electrical energy from said central unit to said devices.

9. Apparatus as in claim 8 wherein said central unit also includes time delay means for delaying the transmission of said reference timing signals for a predetermined time interval after operation is initiated.

10. Apparatus as in claim 5 wherein:

said timing counter means comprises an up-down counter connected to count in one direction from an initial predetermined content between the occurrence of said first and second signals and to subsequently count in the opposite direction; and said activation means is connected to said up-down counter to detect the time when its contents again equals said initial predetermined content and to activate the connected electrical load in response thereto.

11. Apparatus as in claim 5 wherein said preset counter means includes:

a digital counter, logic means connected to provide said first signal when a preset content of the digital counter is established, and means to provide said second signal when the maximum content of the digital counter is established.

12. Apparatus as in claim 11 wherein:

said timing counter means comprises an up-down counter connected to count in one direction from an initial predetermined content between the occurrence of said first and second signals and to subsequently count in the opposite direction; and said activation means is connected to said up-down counter to detect the time when its contents again equals said initial predetermined content and to activate the connected electrical load in response thereto.

13. Apparatus as in claim 12 wherein said activation means includes logic means which permits activation of the electrical load only if the digital counter of the preset counter means has previously reached a predetermined content.

14. Apparatus as in claim 1 [and] *or* 2 wherein said central unit includes plural output channels providing different respectively corresponding reference timing signals on each such channel for use by different corresponding sets of said devices.

15. Apparatus as in claim 2 wherein each of said devices includes an energy dissipation means connected to substantially deplete said energy storage means of its stored energy within a predetermined time after its last receipt of energy from said central unit thereby disabling the device if its electrical load is not activated within such predetermined time.

16. Apparatus as in claim 1 or 2 wherein all of said devices are electrically connected in parallel with said central unit.

17. Apparatus as in claim 1 or 2 wherein each device further includes discrimination means for minimizing the possibility that spurious electrical inputs thereto would result in activation of the connected electrical load.

18. Apparatus as in claim 1 or 2 wherein said central unit is connected to each of said devices by two electrical conductors and wherein each of said devices includes means for accepting and using electrical outputs from the central unit regardless of the relative order in which such conductors are connected or the resulting relative polarity of the electrical outputs supplied to any given device.

19. Apparatus as in claim 1 or 2 wherein each of said electrical loads comprise an electric fusehead disposed to ignite a blasting detonator.

20. An explosives firing control system for selectively energizing a plurality of electric fuseheads after respectively corresponding predetermined time delays, said system comprising:

a fire control unit located at a remote site for providing reference timing signals, and an electrical timing device situated at the site of each electric fusehead and connected to energize its associated fusehead in response to said reference timing signals, each of said timing devices including means for providing first and second signals from the reference signals, a source of locally generated clock pulses, timing counter means for counting the number of said clock pulses occurring between said first and second signals, and means for energizing the associated fusehead after a subsequent time delay measured by counting a number of said clock pulses related to the number previously counted between the occurrence of said first and second signals.

21. An explosives firing control system as in claim 20 wherein:

said fire control unit also provides electrical energy for use in energizing said fuseheads, and each of said timing devices includes an energy storage means connected to receive and store said electrical energy and to supply at least a portion of such energy to its associated fusehead.

22. An explosives firing control system as in claim 21 wherein said energy storage means is also capable of powering the timing device and thus insure its operation after receipt of the reference timing signals even if the timing device is thereafter isolated from the fire control unit.

23. An explosives firing to control system as in claim 20, 21 or 22 wherein the timing means in each of said timing devices begins to measure its respectively corresponding predetermined time delay at a common reference time also defined by said reference timing signals.

24. An explosives firing control system for selectively energizing a plurality of electric fuseheads after respectively corresponding predetermined time delays, said system comprising:

a fire control unit located at a remote site for providing reference timing signals, and an electrical timing device situated at the site of each electric fusehead and connected to energize its associated fusehead in response to said reference timing signals, each of said timing devices including timing means for measuring a reference time interval defined by said reference timing signals and for subsequently energizing its associated fusehead after a respectively corresponding predetermined time delay which delay is determined as a function of said measured reference time interval wherein said reference timing signals comprise a sequence of accurately timed events, and wherein each of said timing means comprises a source of locally generated clock pulses, preset counter means for counting said timed events and for providing first and second signals respectively corresponding to first and second predetermined counter contents, timing counter means for counting the number of said clock pulses occurring between said first and second signals, and means for energizing the associated fusehead after a subsequent time delay measured by counting a number of said clock pulses related to the number previously counted between the occurrence of said first and second signals.

25. An explosives firing control system as in claim 24 wherein said second predetermined counter contents is identical for all of said timing devices.

26. An explosives firing control system as in claim 24 wherein each timing means includes means for initially resetting said preset counter means and said timing counter means to predetermined initial contents.

27. An explosives firing control system as in claim 24 wherein said fire control unit includes means for forming said sequence of accurately timed events as superimposed variations in the flow of electrical energy from said fire control unit.

28. An explosives firing control system as in claim 27 wherein said fire control unit also includes time delay means for delaying the transmission of said reference timing signals for a predetermined time interval after operation is initiated.

29. An explosives firing control system as in claim 24 wherein:

said timing counter means comprises an up-down counter connected to count in one direction from an initial predetermined content between the occurrence of said first and second signals and to subsequently count in the opposite direction; and said means for energizing is connected to said up-down counter to detect the time when its contents again equals said initial predetermined content and to energize the connected fusehead in response thereto.

30. An explosives firing control system as in claim 24 wherein said preset counter means includes:

a digital counter, logic means connected to provide said first signal when a preset content of the digital counter is established, and means to provide said second signal when the maximum content of the digital counter is established.

31. An explosives firing control system as in claim 30 wherein:

said timing counter means comprises an up-down counter connected to count in one direction from an initial predetermined content between the occurrence of said first and second signals and to subsequently count in the opposite direction; and said means for energizing is connected to said up-down counter to detect the time when its contents again equals said initial predetermined content and to energize the connected fusehead in response thereto.

32. An explosives firing control system as in claim 31 wherein said means for energizing includes logic means which permits energization of the fusehead only if the digital counter of the preset counter means has previously reached a predetermined content.

33. An explosives firing control system as claim 20, 21 or 22 wherein said fire control unit includes plural output channels providing different respectively corresponding reference timing signals on each such channel for use by different corresponding sets of said timing devices.

34. An explosives firing control system as in claim 21 wherein each of said timing devices includes an energy dissipation means connected to substantially deplete said energy storage means for its stored energy within a predetermined time after its last receipt of energy from said fire control unit thereby disabling the timing device if its fusehead is not energized within such predetermined time.

35. An explosives firing control system as in claim 20, 21 or 22 wherein all of said timing devices are connected in parallel with said fire control unit.

36. An explosives firing control system as in claim 20, 21 or 22 wherein each timing device further includes discrimination means for minimizing the possibility that spurious electrical inputs thereto would result in energization of connected fusehead.

37. An explosives firing control system as in claim 20, 21 or 22 wherein said fire control unit is connected to each of said timing devices by two electrical conductors and wherein each of said timing devices includes means for accepting and using electrical outputs from the fire control unit regardless of the relative order in which such conductors are connected or the resulting relative polarity of the electrical outputs supplied to any given timing device.

38. An explosives firing control system as in claim 20, 21, or 22 further comprising plural electronic explosive detonators, each of which embodies one of said fuseheads and one of said timing devices.

39. An electrical timing device for activating an electrical load after a predetermined time delay operating in conjunction with a remote unit which provides accurately timed reference signals, said device comprising:

time interval measuring means adapted to receive said accurately timed reference signals and to measure a first time interval associated therewith, said time interval measuring means comprising means for providing first and second signals from said time interval, a source of locally generated clock pulses, and timing counter means for counting the number of clock pulses occuring between said first and second signals, and output means for thereafter activating said electrical load after said predetermined time delay, which is *measured from a reference time defined by said timed reference signals and* determined as a function of said measured frist time invertal, said output means comprising means for activating the electrical load after a subsequent time delay measured by again counting said clock pulses as a function of the number earlier counted between said first and scond signals.

40. An electrical timing device as in claim 39 further comprising:

energy storage means connected to receive and store electrical energy from said remote unit and to supply at least a portion of such stored energy to its associated electrical load aftger said predetermined time delay.

[41. An electrical timing device as in claim 39 and 40 wherein said predetermined time delay in measured from a reference time also defined by said timed reference signals.]

42. An electrical timing device as in claim 39 [and] *or* 40 wherein said device is disposed at the site of its associated electrical load and continues to operate after receipt of said timed reference signals even if thereafter isolated from said remote unit.

43. An electrical timing device for activating an electrical load after a predetermined time delay operating in conjunction with a remote unit which provides accurately timed reference signals, wherein said accurately timed reference signals comprise a sequence of accurately timed events said device comprising:

time intervals measuring means adapted to receive said accurately timed reference signals and to measure a first time interval associated therewith, comprising a source of locally generated clock pulses, preset counter means for counting said timed events and for providing first and second signals respectively corresponding to first and second predetermined counter contents, and a timing conter means for counting the number of clock pulses occurring between said first and second signals; and output means for thereafter activating said electrical load after said predetermined time delay, which is *measured from a reference time defined by said timed reference signals and* determined as a function of said measured first time interval, comprising means for activating the electrical load after a subsequent time delay measured by again counting said clock pulses as a function of the number earlier counted between said first and second signals.

44. An electrical timing device as in claim 43 further comprising means for initially resetting said preset counter means and said timing counter means to predetermined initial contents.

45. An electrical timing device as in claim 43 wherein:

said timing counter means comprises an up-down counter connected to count in one direction from an initial predetermined content between the occurrence of said first and second signals and to subsequently count in the opposite direction; and said output means is connected to said up-down counter to detect the time when its contents again equals said initial predetermined content and to activate the connected electrical load in response thereof.

46. An electrical timing device as in claim 43 wherein said preset counter means includes:

a digital counter, logic means connected to provide said first signal when a preset content of the digital counter is established, and means to provide said second signal when the maximum content of the digital counter is established.

47. An electrical timing device as in claim 43 wherein said output means include logic means wich permits activation of the electrical load only if the digital counter of the preset counter means had previously reached a predetermined content.

48. An electrical timing device as in claim 40 further comprising:

an energy dissipation means connected to substantially deplete said energy storage means of its stored energy within a predetermined time after its last receipt of energy from said central unit thereby disabling the device if its electrical load is not activated within such predetermined time.

49. An electrical timing device as in claim 39 [and] *or* 40 *further* comprising:

discrimination means for minimizing the possibility that spurious electrical inputs thereto would result in activation of the connected electrical load.

50. An electrical timing device as in claim 39 [and] *or* 40 including means for accepting and using electrical outputs from the remote unit regardless of the polarity of such outputs.

51. The combination of an electrical timing device as in claim 39 [and] *or* 40 and an electric fusehead connected as said electrical load.

52. A time delay electric fusehead assembly for use in conjunction witih a remote fire control unit providing accurately timed reference signals, said fusehead assembly comprising:

an electrically activated fusehead, time interval measuring means for receiving said accurately timed reference signals and measuring a time interval associated therewith comprising means for providing first and second signals from said reference signals, a source of locally generated clock pulses and timing counter means for counting the number of clock pulses occurring between said first and second signals, and output means for thereafter activating said fusehead after a predetermined time delay measured *from a reference time defined by said timed reference signals* by again counting said clock pulses as a function of the number earlier counted between said first and second signals.

53. A time delay electric fusehead assembly as in claim 52 further comprising:

energy storage means connected to receive and store electrical energy from said remote fire control unit and to supply at least a portion of such stored energy to its associated fusehead after said predetermined time delay.

[54. A time delay electric fusehead assembly as in claim 52 or 53 wherein said predetermined time delay is measured from a reference time also defined by said timed reference signals.]

55. A time delay electric fusehead assembly as in claim 52 [and] *or* 53 wherein said assembly continues to operate after receipt of said timed reference signals even if thereafter isolated from said remote fire control unit.

56. A time delay electric fusehead assembly for use in conjunction with a remote fire control unit providing accurately timed reference signals wherein said accurately timed reference signals comprise a sequence of accurately timed events said fusehead assembly comprising:

an electrically activated fusehead, time interval measuring means for receiving said accurately time reference signals and measuring a first time interval associated therewith, comprising a source of locally generated clock pulses, preset counter means for counting said time events and for providing first and second signals respectively corresponding to first and second predetermined counter contents, and a timing counter means for counting the number of clock pulses occurring between said first and second signals; and output means for thereafter activating said fusehead after said predetermined time delay, which is *measured from a reference time defined by said timed reference signals, and* determined as a function of said first measured time interval, comprising means for activating the fusehead after a subsequent time delay measured by again counting said clock pulses as a function of the number earlier counted between said first and second signals.

57. A time delay electric fusehead assembly as in claim 56 further comprising means for initially resetting said perset counter means and said timing counter means to predetermined initial contents.

58. A time delay electric fusehead assembly as in claim 56 wherein said timing counter means comprises up-down counter connected to count in one direction from an initial predetermined content between the occurrence of said first and second signals and to subsequently count in the opposite direction; and said output means is connected to said up-down counter to detect the time when its contents again equals said initial predetermined content and to activate the connected fusehead in response thereto.

59. A time delay electric fusehead assembly as in claim 56 wherein said preset counter means includes:

a digital counter, logic means connected to provide said first signal when a preset content of the digital couinter is established, and means to provide said second signal when the maximum content of the digital counter is established.

60. A time delay electric fusehead assembly as in claim 56 wherein said output means includes logic means which permits activation of the electrical fusehead only if the digital counter of the preset counter means has previously reached a predetermined content.

61. A time delay electric fusehead assembly as in claim 53 further comprising:

an energy dissipation means connected to substantially deplete said energy storage means for its stored energy within a predetermined time after its last recepit of energy from said central unit thereby disabling the device if its electrical fusehead is not activated within such predetermined time.

62. A time delay electric fusehead assembly as in claim 52 [and] *or* 53 comprising:

discrimination means for minimizing the possibility that spurious electrical inputs thereto would result in activation of the connected electrical fusehead.

63. A time delay electric fusehead assembly as in claim 52 or 53 including means for accepting and using electrical outputs from the remote fire control unit regardless of the polarity of such outputs.

64. The combination of a time delay electric fusehead assembly as in claim 52 or 53 and a blasting detonator.

* * * * *

UNITED STATES PATENT AND TRADEMARK OFFICE

CERTIFICATE OF CORRECTION

PATENT NO. : Re. 32,888

DATED : March 14, 1989

INVENTOR(S) : Kirby et al.

It is certified that error appears in the above-identified patent and that said Letters Patent is hereby corrected as shown below:

On the title page item [30], "Feb. 2, 1978" should read --Feb. 1, 1978--.

Signed and Sealed this

Twenty-seventh Day of November, 1990

*Attest:*

HARRY F. MANBECK, JR.

*Attesting Officer*

*Commissioner of Patents and Trademarks*